United States Patent
Okabayashi et al.

(10) Patent No.: US 11,687,117 B2
(45) Date of Patent: Jun. 27, 2023

(54) SEMICONDUCTOR APPARATUS, DISPLAY APPARATUS, PHOTOELECTRIC CONVERSION APPARATUS, ELECTRONIC DEVICE, ILLUMINATION APPARATUS, AND MOVABLE BODY

(71) Applicant: CANON KABUSHIKI KAISHA, Tokyo (JP)

(72) Inventors: Daisuke Okabayashi, Yokohama (JP); Tetsuo Takahashi, Kawasaki (JP); Takashi Usui, Ashigarakami-gun (JP)

(73) Assignee: Canon Kabushiki Kaisha, Tokyo (JP)

( * ) Notice: Subject to any disclaimer, the term of this patent is extended or adjusted under 35 U.S.C. 154(b) by 213 days.

(21) Appl. No.: 16/995,243

(22) Filed: Aug. 17, 2020

(65) Prior Publication Data

US 2021/0064079 A1 Mar. 4, 2021

(30) Foreign Application Priority Data

Aug. 30, 2019 (JP) .................................. 2019-158971

(51) Int. Cl.
*G06F 1/16* (2006.01)
*H10K 59/124* (2023.01)
*B60K 35/00* (2006.01)
*H10K 59/65* (2023.01)
*H01L 27/32* (2006.01)

(52) U.S. Cl.
CPC ............ *G06F 1/1605* (2013.01); *B60K 35/00* (2013.01); *H01L 27/3234* (2013.01); *H01L 27/3258* (2013.01); *B60K 2370/1523* (2019.05)

(58) Field of Classification Search
CPC ............. H01L 51/5253; H01L 27/3258; H01L 27/3234; H01L 2251/558; H01L 27/322; H01L 27/3244; H01L 27/3218; G06F 1/1605; G06F 1/1637; G06F 1/1616; B60K 35/00; B60K 2370/1523; B60K 2370/343; B60K 2370/33; B60Q 1/44; B60Q 1/268
See application file for complete search history.

(56) References Cited

U.S. PATENT DOCUMENTS

2015/0155077 A1* 6/2015 Yamazaki ............... H01B 1/04
                                                              216/13

FOREIGN PATENT DOCUMENTS

JP       2012-216495 A     11/2012
JP       2019-32939 A       2/2019

* cited by examiner

*Primary Examiner* — Yaron Cohen
(74) *Attorney, Agent, or Firm* — Canon U.S.A., Inc., IP Division

(57) ABSTRACT

A semiconductor apparatus include a first electrode, an insulating layer covering an end of the first electrode, a functional layer arranged on the first electrode and the insulating layer, and a second electrode arranged above the functional layer, wherein, in a cross-section passing through the insulating layer, and the first electrode, the insulating layer includes a first portion having a side surface inclining at an angle of 45° or more and 90° or less, a second portion having a side surface inclining at an angle smaller than 45°, and a third portion below the first portion, and having a side surface inclining at an angle smaller than 45°, and wherein a length of the second portion in a direction vertical to the first electrode is larger than that of the third portion.

14 Claims, 14 Drawing Sheets

SEMICONDUCTOR APPARATUS, DISPLAY APPARATUS, PHOTOELECTRIC CONVERSION APPARATUS, ELECTRONIC DEVICE, ILLUMINATION APPARATUS, AND MOVABLE BODY

BACKGROUND OF THE INVENTION

Field of the Invention

The present disclosure relates to a semiconductor apparatus, a display apparatus, a photoelectric conversion apparatus, an electronic device, and illumination apparatus, and a movable body.

Description of the Related Art

An organic light emitting element is an element including an upper electrode, a lower electrode, and an organic layer arranged between the upper electrode and the lower electrode. The organic light emitting element emits light by exciting an organic compound contained in the organic layer. As an example of a light emitting apparatus being a semiconductor apparatus, there is a light emitting apparatus including a plurality of organic light emitting elements.

In the light emitting apparatus, by arranging an insulating layer covering the periphery of an end of a lower electrode, it is possible to prevent step disconnection from being generated in an organic layer and an upper electrode due to a step difference at the end of the lower electrode.

Japanese Patent Application Laid-Open No. 2012-216495 (hereinafter, referred to as "PTL1") discusses a method of preventing disconnection of an upper electrode while increasing an opening ratio, by providing a portion parallel to a lower electrode surface in an inside wall surface of an insulating film that is in contact with an organic layer on a lower electrode.

In preventing step disconnection of an organic layer and an upper electrode by utilizing the shape of an inside wall portion as discussed in PTL1, a leak current is sometimes generated between an upper electrode and a lower electrode. Also in a photoelectric conversion apparatus that is an example of a semiconductor apparatus, in a photoelectric conversion element including a photoelectric conversion layer arranged between a lower electrode and an upper electrode, a leak current can possibly be generated between the upper electrode and the lower electrode.

SUMMARY OF THE INVENTION

According to an aspect of the present disclosure, a semiconductor apparatus include a first electrode arranged on an element substrate, an insulating layer covering an end of the first electrode and being arranged on the element substrate, a functional layer arranged on the first electrode and the insulating layer, and a second electrode arranged above the first electrode and the insulating layer via the functional layer, wherein, in a cross-section passing through the element substrate, the insulating layer, and the functional layer, the insulating layer includes a first portion having a side surface inclining at an angle of 45° or more and 90° or less with respect to a parallel surface parallel to a bottom surface of the first electrode, a second portion closer to a side of the element substrate than the first portion, and having a side surface inclining at an angle larger than 0° and smaller than 45° with respect to the parallel surface, and a third portion on a side opposite to the element substrate with respect to the first portion, and having a side surface inclining at an angle larger than 0° and smaller than 45° with respect to the parallel surface, and wherein, in the cross-sectional, a length of the second portion in a direction vertical to the parallel surface is larger than a length of the third portion in the vertical direction.

Further features of the present disclosure will become apparent from the following description of exemplary embodiments with reference to the attached drawings.

DESCRIPTION OF THE EMBODIMENTS

Hereinafter, as an example of a semiconductor apparatus according to the present exemplary embodiment, the details of a light emitting apparatus will be described with reference to the drawings. Each of the following exemplary embodiments describes an example, and numerical values, shapes, materials, components, and the arrangement and connection configuration of the components do not limit the present disclosure.

Figure 1:
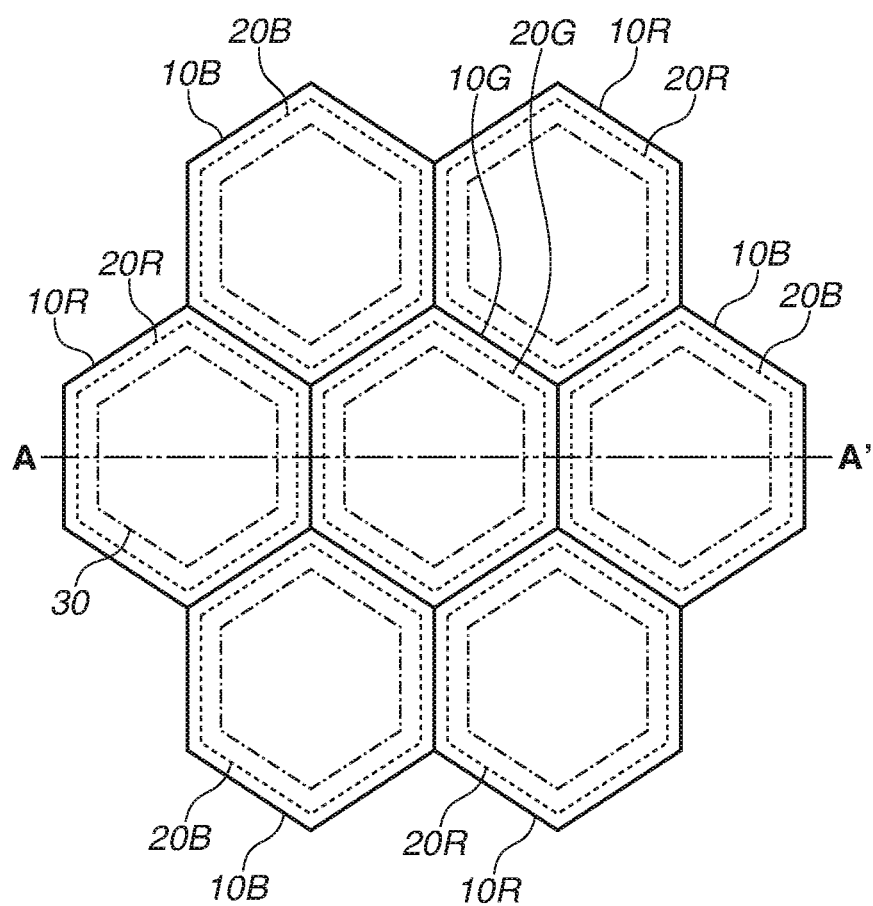
FIG. 1 is a plan view schematically illustrating a configuration of a part of a semiconductor apparatus according to a first exemplary embodiment.

In a first exemplary embodiment, the description will be given of an example in which a light emitting apparatus that is an example of a semiconductor apparatus is applied to a display apparatus. FIG. 1 illustrates a planar configuration diagram of a part of a pixel region of a display apparatus according to the present exemplary embodiment. A plurality of light emitting elements 10 is arrayed on a substrate in a delta shape, and three adjacent light emitting elements 10R, 10B, and 10G form one pixel.

A letter "R" of the light emitting element 10R indicates an element that emits light in red. In a similar manner, the light emitting elements 10B and 10G indicate respective elements that emit light in blue and green. In this specification, for referring to a specific light emitting element of the plurality of light emitting elements 10, an alphabetical letter is added to the end of the reference numeral like the light emitting element 10"R", and when there is no need to make a distinction among the plurality of light emitting elements 10, the plurality of light emitting elements 10 will be simply referred to as light emitting elements "10". The same applies to the other components.

FIG. 1 illustrates a delta array as an example of a pixel array method, but the pixel array method is not limited to this, and any other array may be employed. In addition, FIG. 1 illustrates the light emitting elements of the respective colors that have the same area, but the light emitting elements of the respective colors may have different areas in consideration of the resolution and light emission efficiency of the display apparatus. In addition, a light emitting element illustrated in FIG. 1 is a hexagon in shape, but the shape can be appropriately selected from the shapes of other regular polygons or other shapes.

In addition, FIG. 1 illustrates an example in which three elements form one pixel, but the number of elements needs not be always three. For example, one pixel may include four elements by including two green elements or by further including a white element, in accordance with the resolution and light emission efficiency of the display apparatus. The pitch of adjacent elements and the pitch of adjacent pixels can be arbitrarily set in accordance with pixel density that a display apparatus needs.

Figure 2:
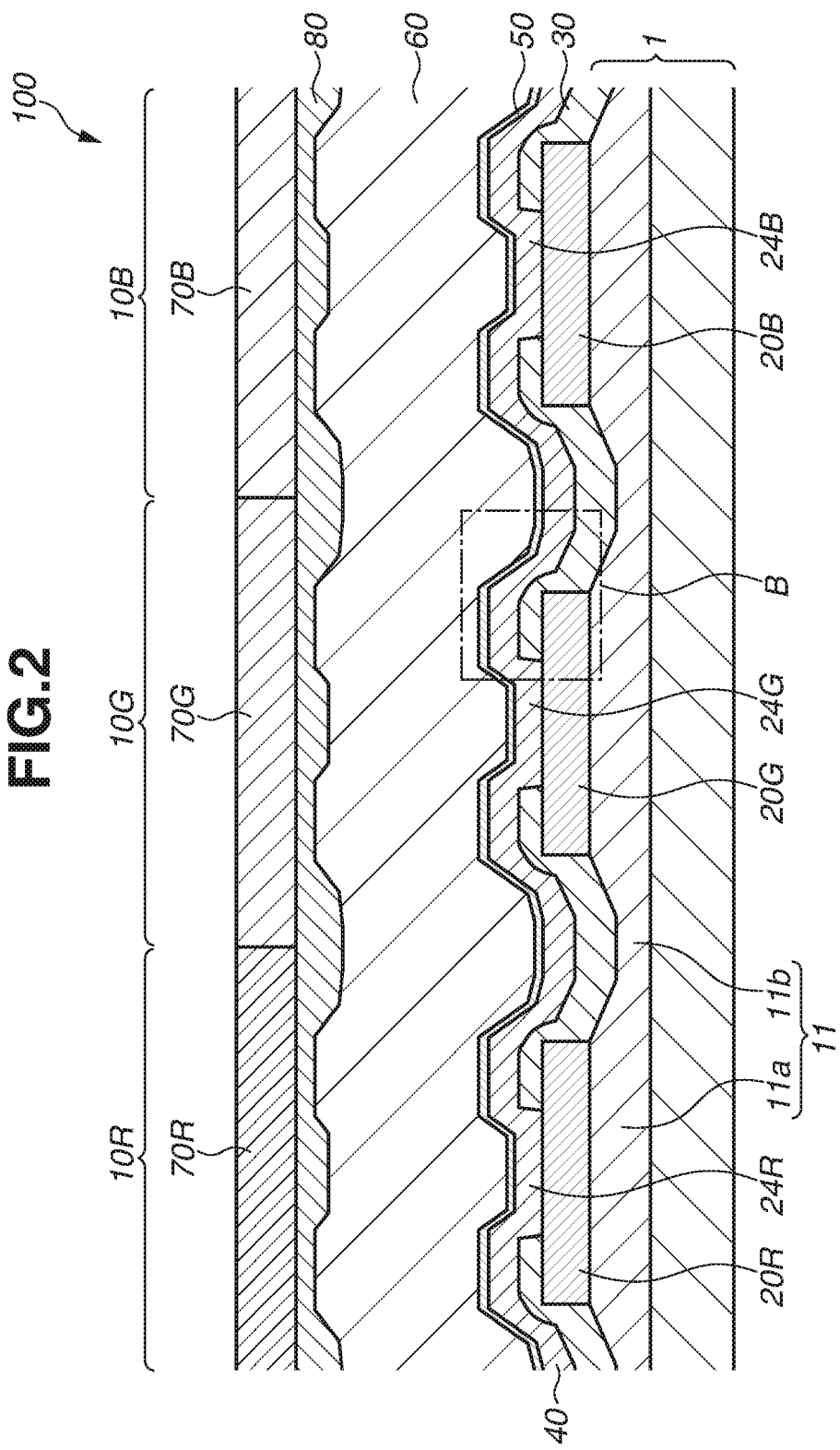
FIG. 2 is a cross-sectional view schematically illustrating a configuration of a part of the semiconductor apparatus according to the first exemplary embodiment.

FIG. 2 illustrates a cross-sectional configuration diagram taken along a broken line A-A' in FIG. 1, and illustrates a configuration of a part of a light emitting apparatus 100 to be applied to the display apparatus. The light emitting apparatus 100 includes a plurality of light emitting elements 10, and the light emitting element 10 includes a lower electrode (first electrode) 20, an upper electrode 50, and an organic layer 40 being arranged between the lower electrode 20 and the upper electrode 50 and including a light emitting layer.

Because the light emitting apparatus will be described as an example of a semiconductor apparatus, the description will be given of an example in which an organic layer including a light emitting layer is arranged as a functional layer between the lower electrode 20 and the upper electrode 50. Nevertheless, for example, when a semiconductor apparatus is a photoelectric conversion apparatus, an organic photoelectric conversion layer is arranged as a functional layer between the lower electrode 20 and the upper electrode 50.

The light emitting apparatus 100 according to the present exemplary embodiment includes the lower electrode 20 arranged on an interlayer insulating layer 11 of an element substrate 1, and an insulating layer 30 covering an end portion of the lower electrode 20 and being arranged on the element substrate 1. In other words, the insulating layer 30 is arranged in such a manner as to separate the lower electrodes 20 for the respective light emitting elements 10. In addition, the light emitting apparatus 100 includes the organic layer 40 being arranged on the lower electrode 20 and the insulating layer 30, and including the light emitting layer, and the upper electrode 50 arranged above the lower electrode 20 and the insulating layer 30 via the organic layer 40.

The light emitting apparatus 100 further includes a protection layer (dampproof layer) 60 arranged in such a manner as to cover the upper electrode 50, and a plurality of color filters (color filter layers) 70 arranged on the protection layer 60 to correspond to the plurality of respective light emitting elements 10. A planarizing layer 80 may be included between the protection layer 60 and the color filters 70.

The element substrate 1 includes a semiconductor element such as a transistor, a capacitance unit, a wiring layer, and an interlayer insulating layer, which are not illustrated in FIG. 2, and the planarized interlayer insulating layer 11 is arranged on the top surface thereof. The interlayer insulating layer 11 can be formed of an inorganic material such as silicon oxide (SiOx), silicon nitride (SiNx), or silicon oxynitride (SION), or an organic material such as acrylic or polyimide, for example.

The lower electrodes 20 are provided with being electrically separated on a light emitting element basis, and also have a function as a reflective layer in addition to a function as a lower electrode of the light emitting element 10. By increasing the reflectance of the lower electrode 20, it is possible to enhance light emission efficiency of an organic light emitting element.

In the lower electrode 20, a metal material having a reflectance of 80% or more with respect to a light emission wavelength of the organic layer 40 may be used. For example, using a sputtering method, a metal such as aluminum (Al) or silver (Ag), or an alloy obtained by adding silicon (Si), copper (Cu), nickel (Ni), or neodymium (Nd) to these metals can be used. In addition, if the reflectance of the lower electrode 20 with respect to the light emission wavelength of the organic layer 40 falls within a desired range, the lower electrode 20 may be a stacked layer including a barrier metal layer. As a material of a barrier layer, a metal such as titanium (Ti), tungsten (W), molybdenum (Mo), or gold (Au), or an alloy thereof may be used. The barrier layer may be a stacked layer or a single layer.

In addition, in the case of using aluminum or an aluminum alloy as the lower electrode 20, for example, an implantation efficiency coordination layer may be provided on a reflective metal layer for preventing oxidation of the surface and enhancing hole implantation efficiency.

As the implantation efficiency coordination layer, for example, any of a high melting point metal such as Ti, W, Mo, chromium (Cr), or tantalum (Ta), an alloy material thereof, and a transparent electrode material such as an indium tin oxide (ITO) or an indium zinc oxide (IZO) can be appropriately selected and used.

In the case of using a high melting point metal such as Ti, it is desirable to set the thickness to 50 nm less in view of a reflectance decline of the lower electrode 20. In addition, from the viewpoint of hole implantation performance, it is desirable that the implantation efficiency coordination layer is formed of a material with a low resistance value.

The insulating layer 30 is provided in such a manner as to cover the side surface of the lower electrode 20. The insulating layer 30 separates the lower electrodes 20 of the respective light emitting elements 10, and defines light emitting regions on the lower electrodes 20. By being provided to exist between the lower electrodes 20 that are adjacently arrayed, the insulating layer 30 covers a top surface rim portion of the lower electrode 20. The insulating layer 30 has an opening 24 in a portion corresponding to a light emitting region on the lower electrode 20. The shape of the insulating layer 30 is not limited to the shape illustrated in FIG. 2 as long as the insulating layer 30 can separate the lower electrodes 20 of the respective light emitting elements 10.

In addition, for suppressing and preventing deterioration in an organic layer that is caused by the influence of moisture, the insulating layer 30 is desirably formed of a material with low moisture content.

For example, the insulating layer 30 can be formed using a chemical vapor deposition method (CVD method), a physical vapor deposition method (PVD method), or an atomic layer deposition (ALD) method. In addition, the insulating layer 30 can be formed of an inorganic material such as silicon oxide (SiOx), silicon nitride (SiNx), or silicon oxynitride (SION), or an organic material such as acrylic or polyimide, for example. The insulating layer 30 may have a stack structure thereof. From the viewpoint of suppressing deterioration in an organic layer that is caused by moisture, the insulating layer is desirably formed of an inorganic material. The insulating layer may mainly contain an inorganic material. The "mainly contain" means that the insulating layer contains 80 wt % or more of the inorganic material or that the insulating layer contains 50 wt % or more of the inorganic material. In this specification, when a certain member A is formed of an inorganic material, the member A may contain an organic material as an impure substance.

The organic layer 40 is arranged between the lower electrode 20 and the upper electrode 50, and is arranged on the lower electrode 20 and the insulating layer 30. The organic layer 40 may be continuously formed over the entire surface of a display region of the light emitting apparatus 100 in which an image is displayed, and shared by the plurality of light emitting elements 10. The organic layer 40 may be integrally arranged on the entire surface of a display region of the light emitting apparatus 100 in which an image is displayed.

The organic layer 40 may include a charge transport layer and a light emitting layer. The charge transport layer refers to at least either a hole transport layer or an electron transport layer. As a material of the organic layer 40, an appropriate material can be selected from the viewpoint of light emission efficiency, driving lifetime, and optical interference.

The hole transport layer in the organic layer 40 may function as an electron block layer or a hole implantation layer, or may have a stack structure including a plurality of layers from among the hole implantation layer, the hole transport layer, and the electron block layer. The light emitting layer may have a stack structure of light emitting layers that emit light in different colors, or may be a mixed layer obtained by mixing light emitting dopants that emit light in different colors. In addition, the electron transport layer may function as a hole block layer or an electron implantation layer, or may have a stack structure including a plurality of layers from among the electron implantation layer, the electron transport layer, and the hole block layer.

In addition, a region between a light emitting layer and an electrode serving as a positive electrode out of the upper electrode 50 and the lower electrode 20 corresponds to a hole transport region, and a region between the light emitting layer and an electrode serving as a negative electrode corresponds to an electron transport region. The hole transport region and the electron transport region will be collectively referred to as a charge transport region.

The upper electrode 50 is arranged on the organic layer 40, and is arranged above the lower electrode 20 and the insulating layer 30 via the organic layer 40. The upper electrode 50 is continuously arranged above a plurality of lower electrodes 20 via the organic layer 40, and shared by a plurality of light emitting elements 10. Similarly to the organic layer 40, the upper electrode 50 may be integrally arranged on the entire surface of a display region of the organic light emitting apparatus 100 in which an image is displayed.

The upper electrode 50 is an electrode that lets through at least a part of light that has reached the bottom surface of the upper electrode 50. The upper electrode 50 may function as a semi-transmissive reflective layer that lets through a part of light and reflects the other part (i.e., semi-transmissive reflectivity).

The upper electrode 50 can be formed of a metal such as magnesium or silver, an alloy mainly containing magnesium or silver, or an alloy material containing an alkali metal or an alkali earth metal, for example. In addition, an oxide conductive member may be used as the upper electrode 50. In addition, the upper electrode 50 may have a stack structure as long as the upper electrode 50 has an appropriate transmissivity.

The protection layer 60 may be formed of a material with low permeability of oxygen and moisture from the outside, such as silicon nitride, silicon oxynitride, aluminum oxide, silicon oxide, or titanium oxide. Silicon nitride and silicon oxynitride may be formed using the CVD method, for example. On the other hand, aluminum oxide, silicon oxide, and titanium oxide may be formed using the ALD method, for example.

A combination of constituent materials and a film formation method of the protection layer 60 is not limited to the above-described example. The protection layer 60 may be formed in consideration of the thickness of a layer to be formed, and a time required for the formation of the layer. The protection layer 60 may have a single-layer structure or a stack structure as long as the protection layer 60 lets through light that passes through the upper electrode 50, and has sufficient moisture barrier performance.

The color filters 70 are arranged above the protection layer 60. The color filters 70 may be tightly arranged in contact with each other like color filters 70R and 70G illustrated in FIG. 2. In addition, a color filter may be arranged to be overlaid upon a color filter of another color.

Figure 3:
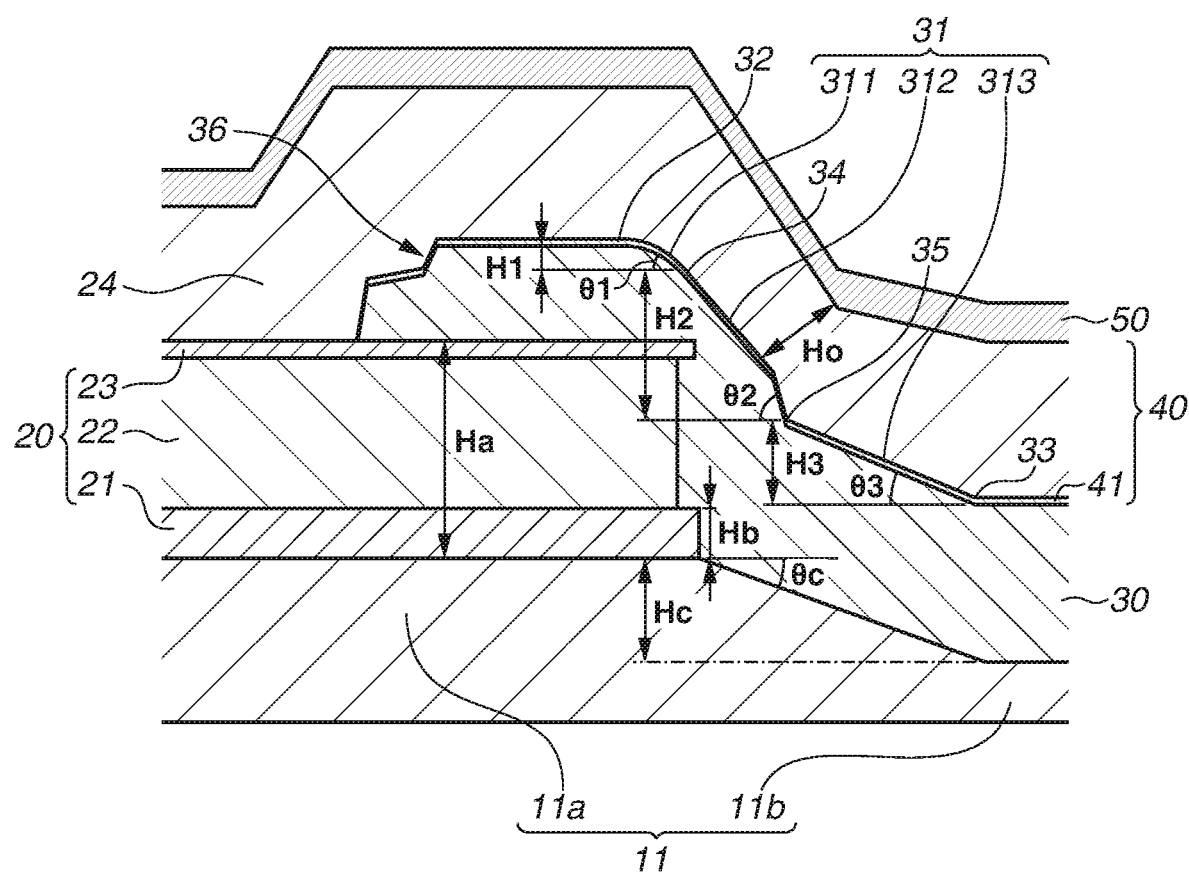
FIG. 3 is an enlarged view of a cross-sectional view schematically illustrating a configuration of a part of the semiconductor apparatus according to the first exemplary embodiment.

FIG. 3 is a diagram illustrating, in an enlarged manner, a location surrounded by a dotted line B in FIG. 2.

The lower electrode 20 can have a configuration in which a barrier metal layer 21, a reflective metal layer 22, and an implantation efficiency coordination layer 23 that adjusts hole implantation efficiency are sequentially stacked on the interlayer insulating layer 11 being a top layer of the element substrate 1. The barrier metal layer 21 may be a single layer or may have a stack structure. The barrier metal layer 21 can have a configuration in which Ti having a thickness within a range of 1 to 50 nm and TiN having a thickness within a range of 1 to 50 nm are stacked on the element substrate 1, for example. The reflective metal layer 22 can be formed of an alloy containing Al, for example. For obtaining high reflectance, the reflective metal layer 22 can have a thickness of 50 nm or more.

The interlayer insulating layer 11 may have a recess portion. For example, a portion of the interlayer insulating layer 11 that is not covered by the lower electrode 20 and is in contact with the insulating layer 30 may be recessed to have a lower height than a portion covered by the lower electrode 20. In a cross-section passing through the element substrate 1, the insulating layer 30, and the organic layer 40 that is illustrated in FIG. 2, the interlayer insulating layer 11 includes an insulating portion 11a being in contact with the bottom surface of the lower electrode 20, and an insulating portion 11b being in contact with the insulating layer 30 without being covered by the lower electrode 20.

In addition, a length of the recess portion in a direction vertical to the bottom surface, that is to say, a length of the insulating portion 11b in the vertical direction is represented as a length Hc. In this case, in this cross-section, a distance from the top surface of the insulating portion 11b to the substrate in the direction vertical to the bottom surface of the lower electrode 20 is smaller than a distance from the bottom surface of the lower electrode 20 to the substrate in the vertical direction.

The bottom surface of the lower electrode 20 refers to a surface on which the lower electrode 20 is in contact with the interlayer insulating layer 11. When a plug for connecting to another conductive line is connected to the lower electrode 20, the bottom surface does not include a portion of the plug.

FIG. 2 illustrates an example in which the top surface of the insulating portion 11b being in contact with the insulating layer 30 inclines starting from the end of the lower electrode 20, with respect to the top surface of the insulating portion 11a being in contact with the bottom surface of the lower electrode 20. FIG. 2 illustrates a case where the insulating portion 11b has three surfaces with constant inclinations, but the top surface of a portion of the interlayer insulating layer 11 that is in contact with the insulating layer 30 may be a curve protruding toward the element substrate 1 side in the cross-section illustrated in FIG. 2.

The implantation efficiency coordination layer 23 can be formed of Ti having a thickness of 1 to 50 nm in view of a reflectance decline of the first electrode 20, for example. The lower electrode 20 includes the barrier metal layer 21, the reflective metal layer 22, and the implantation efficiency coordination layer 23 that adjusts hole implantation efficiency, for example. An upper limit of the thickness of the lower electrode 20 can be determined in consideration of the roughness of the surface or in such a manner that the insulating layer 30 and the organic layer 40 covering the lower electrode 20 can sufficiently cover a step difference formed by the lower electrode 20.

The insulating layer 30 covers the side surface of the lower electrode 20 and has the opening 24 in a portion corresponding to a light emitting region on the lower electrode 20. For example, the insulating layer 30 can have a thickness within a range of 50 to 100 nm.

The insulating layer 30 has an inclined portion 31 in a portion covering the top surface rim portion of the lower electrode 20. In the planar structure illustrated in FIG. 1, the inclined portion 31 is arranged around the six sides of a hexagon.

The inclined portion 31 at least includes inclined portions 311, 312, and 313. In a cross-section passing through the element substrate 1, the insulating layer 30, and the organic layer 40 that is illustrated in FIG. 3, the inclined portion 312 has a side surface inclining at an angle of 45° or more and 90° or less with respect to a surface parallel to the bottom surface of the lower electrode 20. In the cross-section, the inclined portion 313 exists inferiorly to the inclined portion 312 (on the element substrate side), and has a side surface inclining at an angle larger than 0° and smaller than 45° with respect to the parallel surface. In the cross-section, the inclined portion 311 exists superiorly to the inclined portions 312 and 313 (on the functional layer side, i.e., on the opposite side to the element substrate), has a side surface inclining at an angle larger than 0° and smaller than 45°.

Angles of inclinations of the side surfaces of the above-described inclined portions 311, 312, and 313 with respect to the bottom surface of the lower electrode 20 are represented as inclination angles $\theta 1$, $\theta 2$, and $\theta 3$, respectively.

In addition, the organic layer 40 includes a hole transport layer 41, and has a location where a thickness becomes the smallest at a location where the organic layer 40 covers the inclined portion 31. The thickness of a portion at which the organic layer 40 becomes the thinnest is represented as a thickness Ho. An upper end 32 and a lower end 33 of the inclined portion 31 are provided at both end positions at which an inclination angle becomes 0°.

In the present exemplary embodiment, the inclination angles $\theta 1$, $\theta 2$, and $\theta 3$ of the inclined portions 311, 312, and 313 of the insulating layer 30 may be constant in the respective inclined portions. Alternatively, the inclination angles $\theta 1$, $\theta 2$, and $\theta 3$ may change in midstream as long as the changed angles fall within the above-described respective ranges of angles, or the angles may gradually change along the inclined portions.

More specifically, the inclination angles $\theta 1$ and $\theta 3$ are only required to be an angle larger than 0° and smaller than 45°, and the inclination angle $\theta 2$ is only required to be an angle of 45° or more and 90° or less. Boundaries between the inclined portions 311, 312, and 313 are provided at a point 34 at which the inclination angle becomes 45° or more and a point 35 at which the inclination angle becomes 45° or less from the upper end 32 toward the lower end 33. In the present exemplary embodiment, for example, FIG. 3 illustrates an example in which the inclination angle $\theta 1$ gradually changes along the inclined portion, the inclination angle $\theta 2$ changes in midstream, and the inclination angle $\theta 3$ is constant.

As illustrated in FIG. 3, a length of the inclined portion 311 in a direction vertical to the bottom surface of the lower electrode 20 is represented as a length H1. In a similar manner, lengths of the inclined portions 312 and 313 in the direction vertical to the bottom surface of the lower electrode 20 are represented as a length H2 and a length H3, respectively.

In addition, the lower electrode 20 has a thickness Ha, and the barrier metal layer 21 being a part of the lower electrode 20 has a thickness Hb. The thicknesses Ha and Hb refer to lengths in a direction vertical to a surface parallel to the bottom surface of the lower electrode 20 (lengths from the bottom surfaces to the top surfaces of the lower electrode 20 and the barrier metal layer 21 in the vertical direction).

The length H3 of the inclined portion 313 in the vertical direction is larger than the length H1 of the inclined portion 311 in the vertical direction. By the insulating layer 30 having such a structure, it is possible to prevent a film thickness of the organic layer 40 arranged on the lower electrode 20 and the insulating layer 30, from becoming too small, and suppress a leak current generated between the lower electrode 20 and the upper electrode 50. For example, the length H1 of the inclined portion 311 can be set to 1 to 50 nm, and the length H3 of the inclined portion 313 can be set to 10 to 100 nm.

The inclination angle θ3 of the inclined portion 313 can be changed by adjusting an angle θc of an inclination of the insulating portion 11b of the interlayer insulating layer 11, for example. If the angle θc of the insulating portion 11b of the interlayer insulating layer 11 with respect to a surface parallel to the bottom surface of the lower electrode 20 is made larger, an angle of the inclined portion 313 with respect to the parallel surface also becomes larger. On the other hand, if the angle θc of the insulating portion 11b of the interlayer insulating layer 11 with respect to a surface parallel to the bottom surface of the lower electrode 20 is made smaller, an angle of the inclined portion 313 also becomes smaller.

It is desirable that the angle θc of a portion of the insulating portion 11b of the interlayer insulating layer 11 that inclines starting from the end of the lower electrode 20, with respect to a surface parallel to the bottom surface of the lower electrode 20 is set to an angle of 10° or more and smaller than 45°. If the angle θc of the insulating portion 11b is set to an angle smaller than 10°, due to a residual error generated in patterning the adjacent lower electrode 20, the lower electrodes 20 are electrically connected in some cases. In addition, by setting the angle θc of the insulating portion 11b to an angle smaller than 45°, the inclination angle θ3 of the inclined portion 313 of the insulating layer 30 arranged thereon can be set to an angle of 0° or more and smaller than 45°.

In addition, if the length Hc of the insulating portion 11b in the vertical direction is made larger, the length H3 becomes larger, and if the length Hc is made smaller, the length H3 becomes smaller. Accordingly, the inclination of the inclined portion 313 can be controlled, and the length H3 of the inclined portion 313 in the vertical direction can be made larger than the length H1 of the inclined portion 311 in the vertical direction.

It is desirable that the length Hc of the insulating portion 11b in the vertical direction is 30 nm or more and 80 nm or less.

In addition, the top surface of the insulating portion 11b of the interlayer insulating layer 11 that is in contact with the insulating layer 30 may be a curve protruding toward the element substrate 1 side starting from the end of the lower electrode 20. A change in inclination angle of the inclined portion 313 of the insulating layer 30 arranged on the insulating portion 11b can be thereby made gradual. Accordingly, it is possible to prevent step disconnection of the organic layer 40 and the upper electrode 50 that is caused by an inclination angle drastically changing at a certain point in the inclined portion 31.

In addition, the length H3 of the inclined portion 313 is larger than the thickness Hb of the barrier metal layer 21. In addition, the length H2 of the inclined portion 312 is smaller than the thickness Ha of the lower electrode 20. This can further prevent the thickness Ho of a portion of the hole transport layer 41 at which a film thickness is the smallest, from becoming too thin in the inclined portion 31 of the insulating layer 30, and it becomes possible to suppress a leak current of the organic layer 40 that is generated between the lower electrode 20 and the upper electrode 50. On the other hand, because the insulating layer 30 also includes the inclined portion 312 having the inclination angle of 45° or more, it is possible to suppress a leak current generated between the light emitting elements 10, by locally raising a resistance value of the hole transport layer 41 formed on the inclined portion 312.

It is desirable that the thickness Ho of the portion of the organic layer 40 at which a film thickness is the smallest is 35 nm or more.

In addition, it is desirable that the inclined portion 312 includes a portion in which the inclination angle θ2 becomes 55° or more and 90° or less. It is possible to suppress a leak current generated between the light emitting elements 10 without making a film thickness of the hole transport layer 41 too thick. In the example described in the present exemplary embodiment, it is desirable that a length of the portion of the inclined portion 312 in which the inclination angle θ2 becomes 55° or more and 90° or less is 30 nm to 50 nm.

The insulating layer 30 has the opening 24 in a portion corresponding to a light emitting region. The insulating layer 30 may include a recess portion 36 on the side surface on which the opening 24 is formed. With this configuration, a sufficient film thickness of the organic layer 40 can be ensured similarly to the above-described case, and a leak current generated between the lower electrode 20 and the upper electrode 50 of the light emitting element 10 can be suppressed.

The light emitting apparatus according to the present exemplary embodiment can be formed in the following manner, for example.

A semiconductor element such as a transistor, a capacitance unit, a wiring layer, and an interlayer insulating layer, which are not illustrated, are formed. Subsequently, for example, an insulating film is formed by using a plasma CVD method, or a high-density plasma CVD method, or by combining these manufacturing methods, the interlayer insulating layer 11 serving as a top layer of the element substrate 1 is formed. The interlayer insulating layer 11 can contain at least any of silicone oxide (SiOx), silicon nitride (SiNx), or silicon oxynitride (SION), for example, or can be a stacked layer of these. After the interlayer insulating layer 11 is formed, the surface is planarized using a chemical mechanical polishing (CMP) method. In addition, a plug connecting the lower electrode 20 and the wiring layer is formed.

Figure 4:
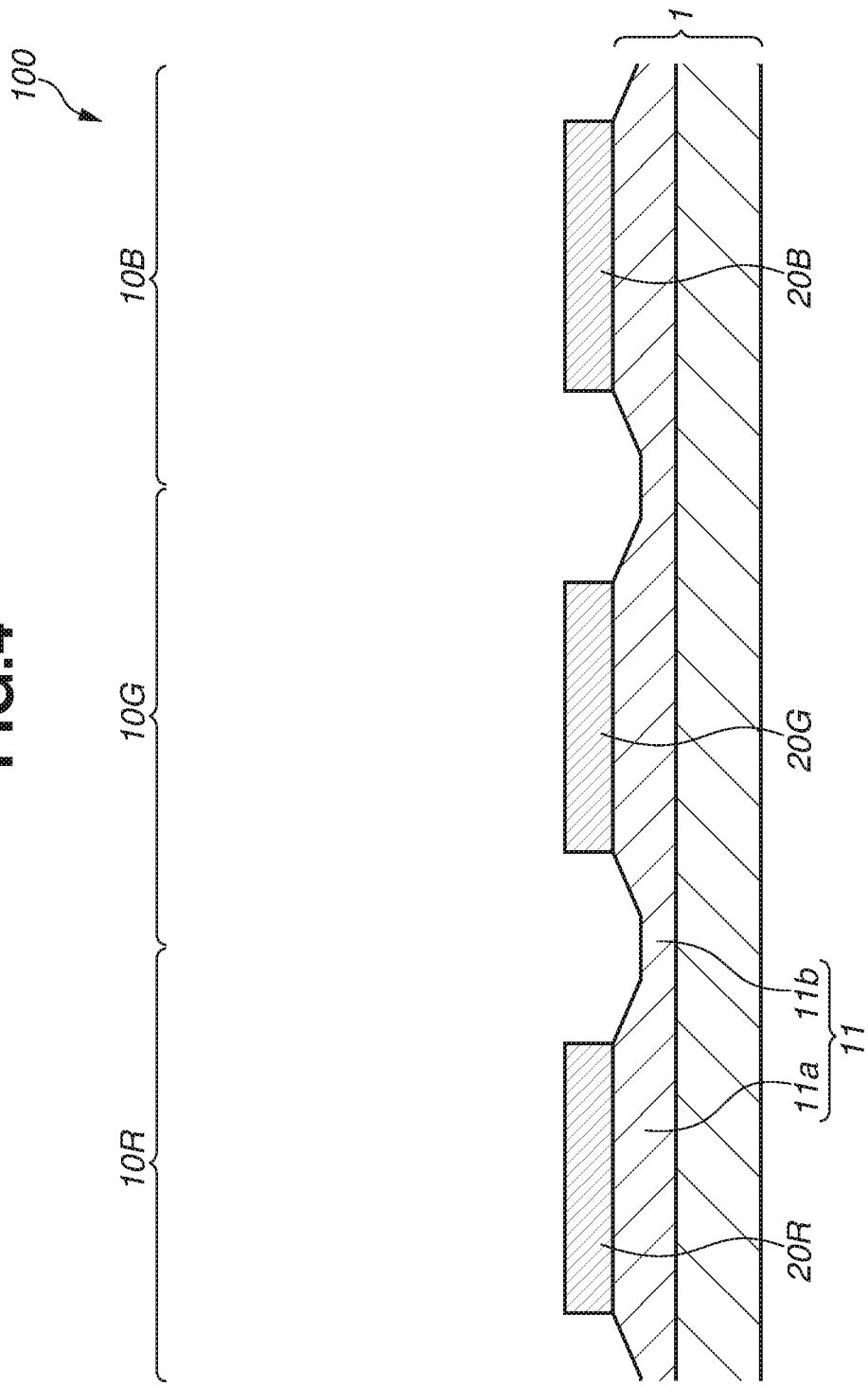
FIG. 4 is a diagram illustrating an example of a manufacturing process of the semiconductor apparatus according to the first exemplary embodiment.

Next, as illustrated in FIG. 4, the lower electrode 20 is formed on the element substrate 1 using a sputtering method, for example. As illustrated in FIG. 3, the lower electrode 20 may be a stacked layer including the barrier metal layer 21 containing Ti and TiN, the reflective metal layer 22 containing an AL alloy, and the implantation efficiency coordination layer 23 containing Ti. Next, the lower electrode 20 is formed by patterning these metal films into a desired shape using a photolithography method and an etching method.

In the present exemplary embodiment, in performing patterning in the formation of the lower electrode 20, the surface of the interlayer insulating layer 11 may be simultaneously etched. A portion of the interlayer insulating layer 11 that is not covered by the lower electrode 20 is thereby etched into a recess portion. By adjusting the type and a flow rate of gas to be used at this time, the top surface of the insulating portion 11b of the interlayer insulating layer 11 that is not covered by the lower electrode 20 can be formed into a curve protruding toward the substrate side as illustrated in FIGS. 2 and 3.

The formation of the recess portion of the interlayer insulating layer 11 may be performed in a process different from a patterning process of the lower electrode 20, but by performing the formation of the recess portion in a process that is the same as the patterning process, the number of processes can be reduced, and time and cost can be saved. In addition, it is possible to suppress a leak current generated between the lower electrodes 20 of the light emitting elements 10 due to an etching residual error of a metal film to be formed into the lower electrode 20.

The inclination of the inclined portion 31 of the insulating layer 30 may be adjusted in the formation of the insulating layer 30 as described below, may be adjusted by the shape of the above-described interlayer insulating layer 11, or may be adjusted using both of them.

In the process of patterning a metal film using an etching method, an interlayer insulating layer being a top layer of the element substrate 1 may be simultaneously patterned. In addition, by patterning using the etching method, it is possible to adjust the shapes of the side surface of the lower electrode 20 and the interlayer insulating layer being the top layer of the element substrate 1.

Figure 5:
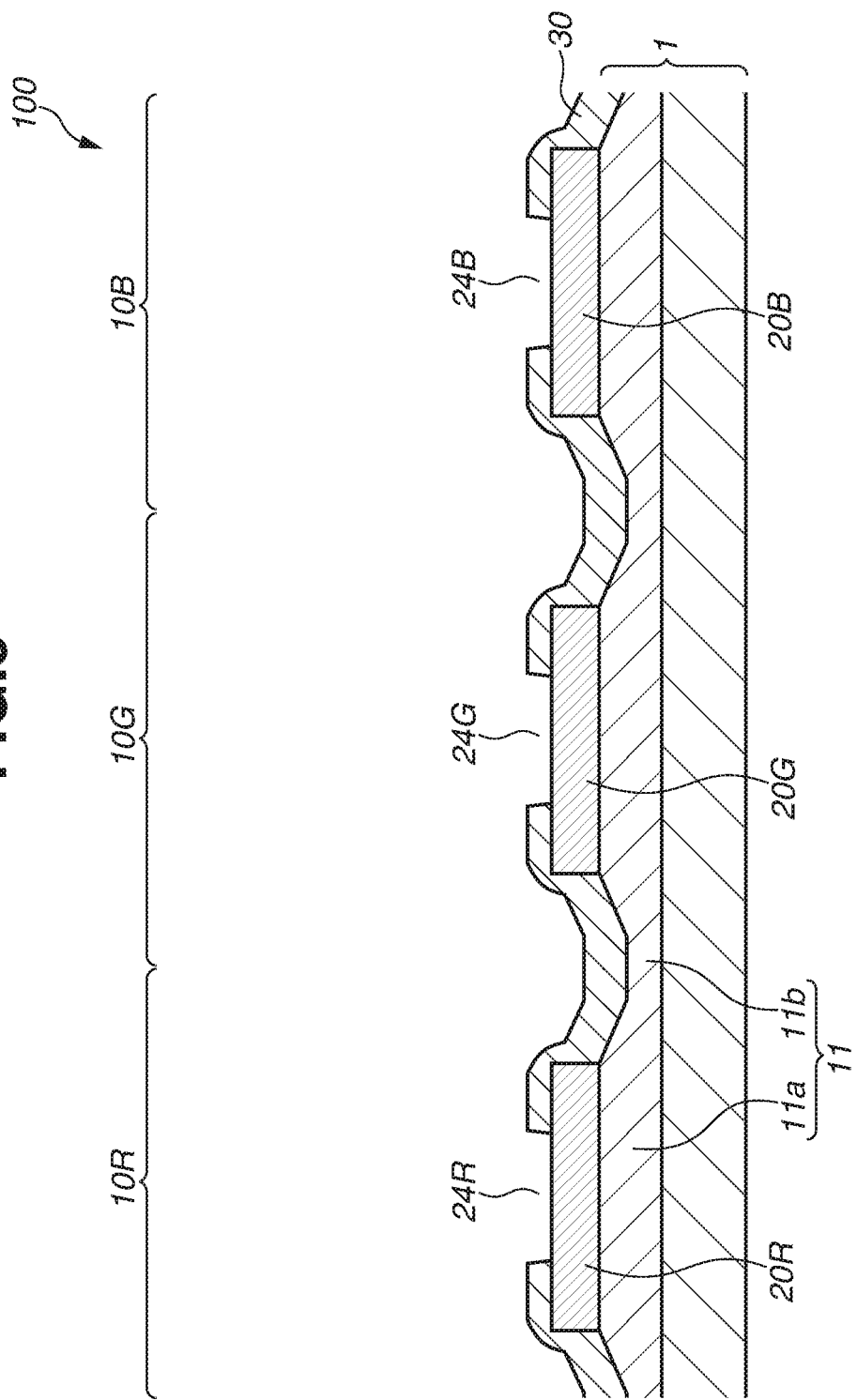
FIG. 5 is a diagram illustrating an example of a manufacturing process of the semiconductor apparatus according to the first exemplary embodiment.

Subsequently, as illustrated in FIG. 5, the insulating layer 30 containing silicone oxide (SiOx), for example, is formed on the lower electrode 20 by using the plasma CVD method, or the high-density plasma CVD method, or by combining these manufacturing methods. In the high-density plasma CVD method, in a process of depositing a film, by utilizing sputtering reaction using Ar gas, for example, the inclination of the insulating layer 30 covering the side surface of the lower electrode 20 can be adjusted. Accordingly, film formation is performed while adjusting a flow rate of Ar gas in such a manner that the respective inclination angles of the above-described inclined portions 311, 312, and 313 become angles within the desirable ranges.

Next, the above-described insulating layer that is to be formed into the insulating layer 30 is patterned into a predetermined shape by the photolithography method and a dry etching method, and the corresponding opening 24 is formed on the lower electrode 20. At this time, the recess portion 36 illustrated in FIG. 3 can be simultaneously formed.

Next, by performing cleaning, foreign substances on the substrate to be subjected to the formation of an organic layer in the next process are removed. After such a cleaning process, it is desirable that moisture on the element substrate 1 surface on which the lower electrode 20 and the insulating layer 30 are arranged is removed by executing dewatering processing.

Figure 6:
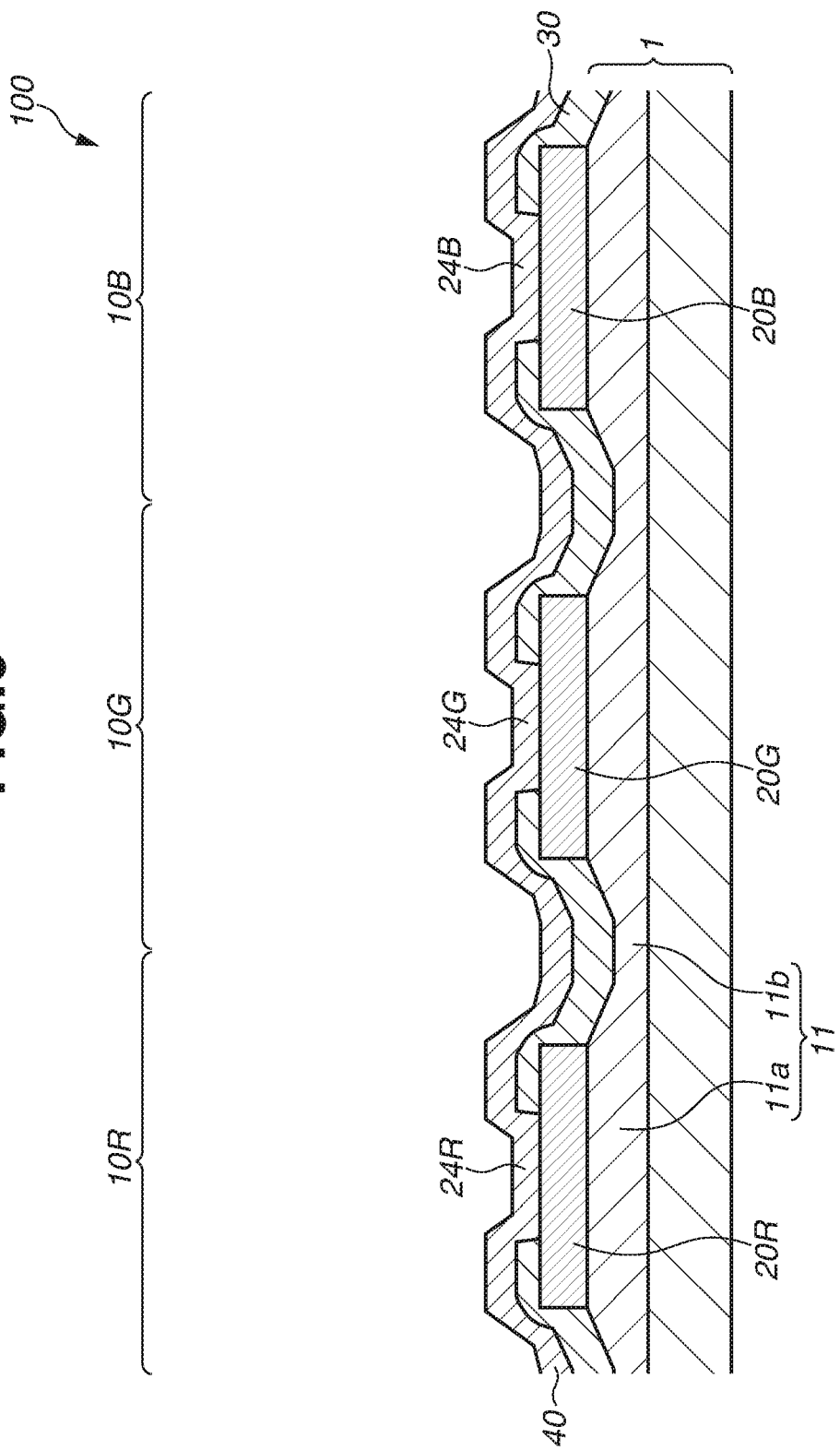
FIG. 6 is a diagram illustrating an example of a manufacturing process of the semiconductor apparatus according to the first exemplary embodiment.

Subsequently, as illustrated in FIG. 6, the organic layer 40 is formed using a vacuum deposition method, for example. For example, materials of an organic layer such as a hole implantation layer, a hole transport layer, a light emitting layer, and an electron transport layer are sequentially deposited.

Figure 7:
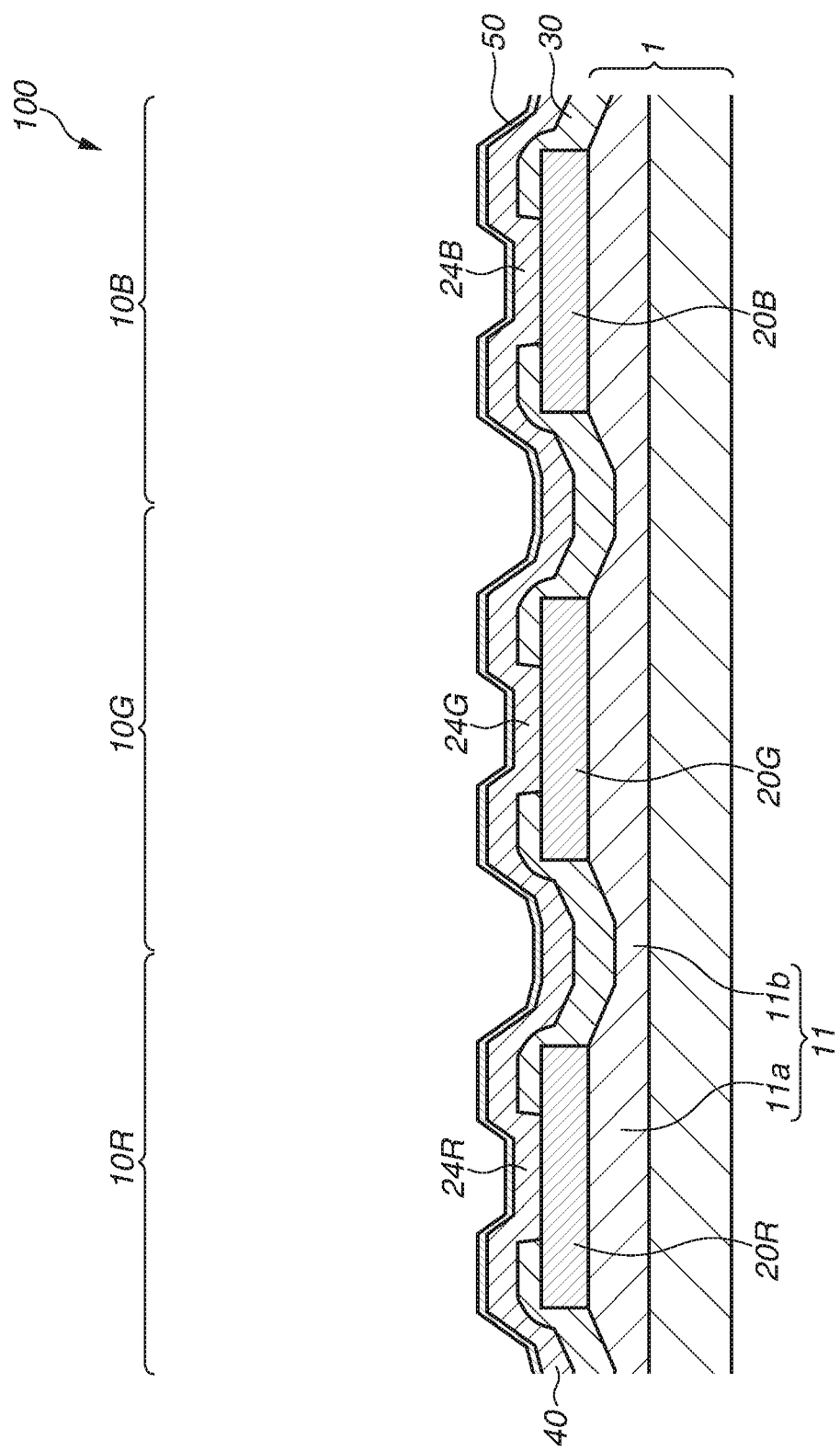
FIG. 7 is a diagram illustrating an example of a manufacturing process of the semiconductor apparatus according to the first exemplary embodiment.

Subsequently, as illustrated in FIG. 7, the upper electrode 50 is formed using the vacuum deposition method without releasing from reduced-pressure atmosphere to atmosphere. In the above-described vacuum deposition method, each material layer can be selectively deposited in a predetermined region by using a metal mask.

Figure 8:
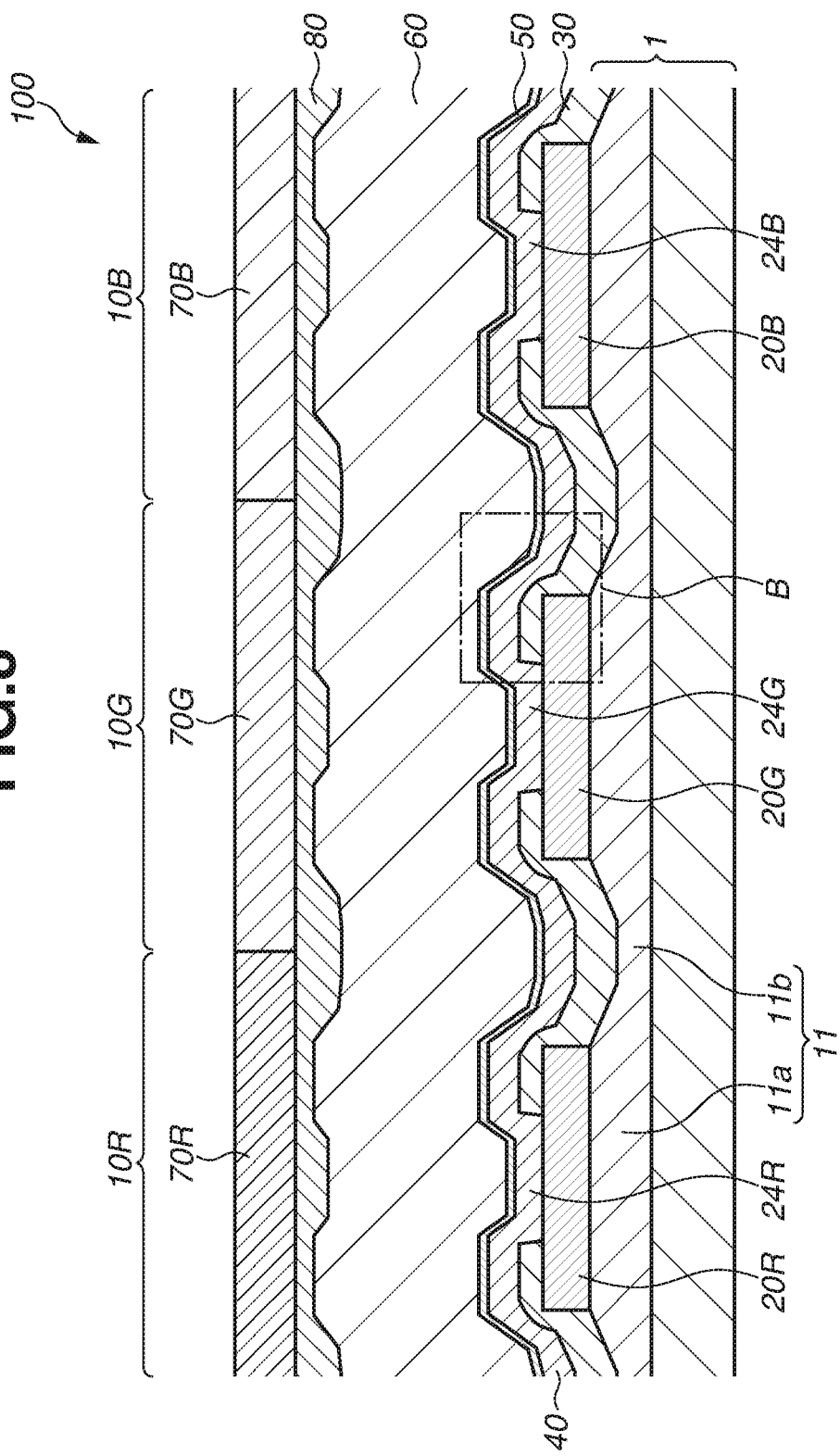
FIG. 8 is a diagram illustrating an example of a manufacturing process of the semiconductor apparatus according to the first exemplary embodiment.

Next, as illustrated in FIG. 8, a dampproof layer 60 is formed so as to cover the upper electrode 50, by using the plasma CVD method, the sputtering method, or the ALD method, or by combining these manufacturing methods, for example. The dampproof layer 60 is an insulating layer, and can be formed of silicon nitride (SiNx), for example. It is desirable that a film formation temperature of the dampproof layer 60 is set to a temperature equal to or smaller than a decomposition temperature of an organic material included in a light emitting layer. For example, it is desirable that the film formation temperature is set to 120° C. or less.

Next, after the planarizing layer 80 is formed on the dampproof layer 60, a red filter is formed by applying a material of the red filter and performing patterning by photolithography, for example. Then, by sequentially forming a green filter and a blue filter similarly to the red filter, the color filter layer 70 is formed. It is desirable that a processing temperature in a formation process of the color filter layer 70 is set to a temperature equal to or smaller than a decomposition temperature of an organic material included in a light emitting layer. For example, it is desirable that the processing temperature is set to 120° C. or less. In addition, a planarizing layer, which is not illustrated, may be formed on the color filter layer 70 as well, and the planarizing layer may be formed of the same material as the planarizing layer 80, for example.

Through the above-described processes, the light emitting apparatus according to the present exemplary embodiment can be formed.

In the light emitting apparatus, if the light emitting element 10 includes an organic layer having a similar configuration regardless of a light emitting color, as described in the present exemplary embodiment, the organic layer 40 continuous over a plurality of light emitting elements 10 is arranged in some cases. In such a light emitting apparatus, leak of current can possibly be generated between light emitting elements 10 adjacent via the organic layer 40 (e.g., charge transport region). The leak current between the light emitting elements 10 leads to unexpected light emission, and when the light emitting apparatus is used in a display apparatus, a color gamut indicating representation performance of the display apparatus is narrowed.

In the light emitting apparatus according to the present exemplary embodiment, because the insulating layer 30 covering the end of the lower electrode 20 includes the inclined portion 312 having the side surface inclining at an angle of 45° or more and 90° or less with respect to a surface parallel to the bottom surface of the lower electrode 20, a film thickness of the hole transport layer 41 can be controlled. Accordingly, a leak current generated between the light emitting elements 10 via the organic layer 40 can be suppressed.

On the other hand, the insulating layer 30 includes the inclined portions 311 and 313 having the side surfaces inclining at an angle larger than 0° and smaller than 45° with respect to a surface parallel to the bottom surface of the lower electrode 20. Furthermore, the length H3 of the inclined portion 313 in a direction vertical to the parallel surface is larger than the length H1 of the inclined portion 311 in the vertical direction. Accordingly, it is possible to suppress a leak current generated between the lower electrode 20 and the upper electrode 50 by a film thickness of the organic layer 40 becoming too small.

In addition, in the present exemplary embodiment, the description has been given using an example of a display apparatus, but the insulating layer 30 can also be used in a photoelectric conversion apparatus including a plurality of photoelectric conversion elements including an organic photoelectric conversion layer as a functional layer. In the photoelectric conversion apparatus that uses an organic layer, a continuous organic photoelectric conversion layer is arranged in such a manner as to cover a plurality of lower electrodes 20. Accordingly, there is a possibility that a leak current is generated between the plurality of lower electrodes via the organic photoelectric conversion layer, and noise is consequently generated.

Thus, by thinning an organic layer, a leak current due to lower electrodes between adjacent photoelectric conversion elements can be suppressed. Nevertheless, by thinning an organic layer, it becomes easier to generate a leak current between an upper electrode and a lower electrode.

In view of the foregoing, by employing a photoelectric conversion element including the insulating layer 30 described in the present exemplary embodiment, it is possible to suppress a leak current generated between the lower electrode 20 and the upper electrode 50 by a film thickness of the organic layer 40 becoming too small.

Figure 9:
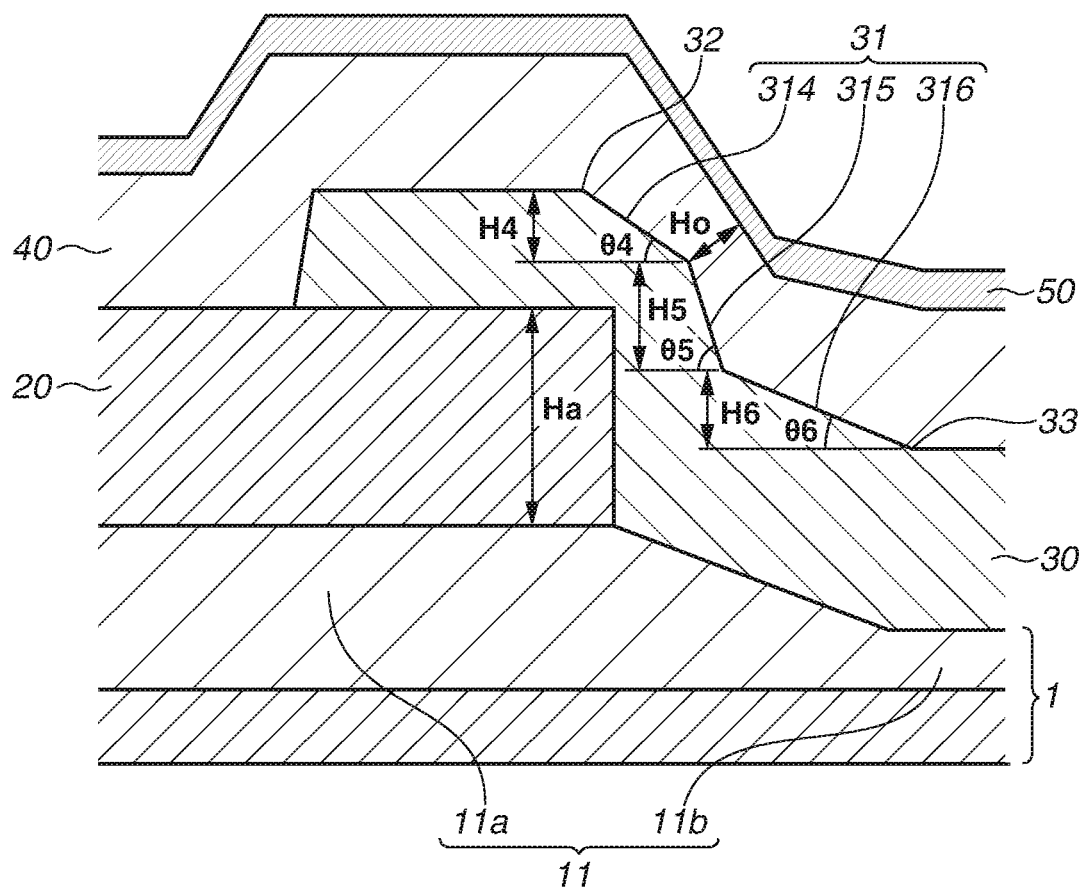
FIG. 9 is an enlarged view of a cross-sectional view schematically illustrating a configuration of a part of a semiconductor apparatus according to a second exemplary embodiment.

FIG. 9 is a diagram illustrating a light emitting apparatus according to a second exemplary embodiment. The description of the components similar to those in the light emitting apparatus 100 according to the first exemplary embodiment will be omitted.

In the second exemplary embodiment, the lower electrode 20 can include an alloy containing Al, for example, and have a thickness of 50 nm or more for achieving high reflectance.

An upper limit of the thickness of the lower electrode 20 can be determined in consideration of the roughness of the surface or in such a manner that the insulating layer 30 and the organic layer 40 covering the lower electrode 20 can sufficiently cover a step difference formed by the lower electrode 20.

The insulating layer 30 covers an end of the lower electrode 20, and has an opening in a portion corresponding to a light emitting region on the lower electrode 20. For example, the insulating layer 30 can have a thickness within a range of 50 to 100 nm.

The insulating layer 30 includes the inclined portion 31 in a portion covering the top surface rim portion of the lower electrode 20. The inclined portion 31 includes inclined portions 314, 315, and 316. The inclined portion 315 has a side surface inclining at an angle of 45° or more and 90° or less with respect to a surface parallel to the bottom surface of the lower electrode 20. The inclined portion 316 exists inferiorly to the inclined portion 315 (on the element substrate 1 side), and has a side surface inclining at an angle larger than 0° and smaller than 45° with respect to the parallel surface. The inclined portion 314 exists superiorly to the inclined portion 315 (on the organic layer 40 side), and has a side surface inclining at an angle larger than 0° and smaller than 45°. In addition, the organic layer 40 has a location where a thickness becomes the smallest at a location where the organic layer 40 covers the inclined portion 31, and the thickness of the location is represented as a thickness Ho.

An upper end 32 and a lower end 33 of the inclined portion 31 are provided at both end positions at which an inclination angle becomes 0°. In the planar structure illustrated in FIG. 1, the inclined portion 31 is arranged around the six sides of a hexagon of the lower electrode 20.

Angles of inclinations of the side surfaces of the above-described inclined portions 314, 315, and 316 with respect to the bottom surface of the lower electrode 20 are represented as inclination angles $\theta 4$, $\theta 5$, and $\theta 6$, respectively.

In addition, a length of the inclined portion 314 in a direction vertical to the bottom surface of the lower electrode 20 is represented as a length H4. A length of the inclined portion 315 in the direction vertical to the bottom surface of the lower electrode 20 is represented as a length H5. Furthermore, a length of the inclined portion 316 in the direction vertical to the bottom surface of the lower electrode 20 has a height of a length H6. In addition, the lower electrode 20 has a thickness Ha in the direction vertical to the bottom surface of the lower electrode 20.

In the present exemplary embodiment, the inclination angles $\theta 4$, $\theta 5$, and $\theta 6$ of the inclined portions 314, 315, and 316 of the insulating layer 30 are constant in the respective inclined portions 314, 315, and 316 as illustrated in FIG. 9. The inclination angles $\theta 4$, $\theta 5$, and $\theta 6$ are not equal to each other, and boundaries between the inclined portions 314, 315, and 316 are provided at a point at which an inclination angle becomes 45° or more, and at a point at which an inclination angle becomes 45° or less.

The length H6 of the inclined portion 316 is larger than the length H4 of the inclined portion 314. By the insulating layer 30 having such a structure, it is possible to suppress a leak current generated between the lower electrode 20 and the upper electrode 50 by a film thickness of the organic layer 40 arranged on the lower electrode 20 and the insulating layer 30 becoming too small. For example, the length H4 of the inclined portion 314 can be set to 1 to 50 nm, and the length H6 of the inclined portion 316 can be set to 10 to 100 nm.

In addition, the length H5 of the inclined portion 315 is smaller than the thickness Ha of the lower electrode 20. Desirably, the inclination angle $\theta 5$ of the inclined portion 315 is set to 55° to 90°, and the length H5 can have a height of 30 nm to 50 nm. This can further prevent the thickness Ho of a portion of the organic layer 40 at which a film thickness is the smallest, from becoming too thin in the inclined portion 31 of the insulating layer 30, and it becomes possible to suppress a leak current of the organic layer 40 that is generated between the lower electrode 20 and the upper electrode 50. It is desirable that the thickness Ho is set to 35 nm or more.

On the other hand, because the insulating layer 30 also includes the inclined portion 315 having an inclination angle of 45° or more, it is possible to suppress a leak current generated between the light emitting elements 10, by locally raising a resistance value of the organic layer 40 (the hole transport layer 41) formed on the inclined portion 315.

In a third exemplary embodiment, a specific configuration and an application example of the light emitting apparatus according to the first or second exemplary embodiment will be described with reference to FIGS. 10 to 14B.

[Configuration of Light Emitting Element 10]

In the light emitting element 10, a positive electrode, an organic compound layer, and a negative electrode are arranged on an element substrate including an interlayer insulating layer on the top surface. A protection layer and a color filter may be provided on the negative electrode. When a color filter is provided, a planarizing layer may be provided between the color filter and the protection layer. The planarizing layer can be formed of acrylic resin.

[Substrate]

Example of the substrate include quartz, glass, a silicon wafer, resin, and metal. In addition, a switching element such as a transistor and a conductive line may be provided on the substrate, and an insulating layer may be provided thereon. The material of the insulating layer is not limited as long as a contact hole can be formed for ensuring electrical connection between a positive electrode 2 and the conductive line, and insulation from an unconnected conductive line can be ensured. For example, resin such as polyimide, silicone oxide, or silicon nitride can be used.

[Interlayer Insulating Layer]

The interlayer insulating layer can be formed of an inorganic material such as silicone oxide (SiOx), silicon nitride (SiNx), or silicon oxynitride (SION) or an organic material such as acrylic or polyimide, for example.

[Electrode]

A pair of electrodes can be used as the electrode. The pair of electrodes may be a positive electrode and a negative electrode. In the case of applying an electric field in a direction in which an organic light emitting element emits light, an electrode with a high potential serves as a positive electrode, and the other electrode serves as a negative electrode. In addition, it can also be said that an electrode that supplies a hole to a light emitting layer serves as a positive electrode, and an electrode that supplies an electron serves as a negative electrode.

As a constituent material of a positive electrode, a material having a work function as large as possible is desirably used. For example, a single metal such as gold, platinum, silver, copper, nickel, palladium, cobalt, selenium, vanadium, or tungsten, a mixture of these, or an alloy obtained by combining these can be used. In addition, for example, a metal oxide such as tin oxide, zinc oxide, indium oxide, indium tin oxide (ITO), or indium zinc oxide can be used. Furthermore, a conductive polymer such as polyaniline, polypyrrole, or polythiophene can also be used.

One type of these electrode materials may be used by itself, or two or more types may be used in combination. In addition, a positive electrode may include a single layer, or may include a plurality of layers.

In the case of using an electrode as a repeller, for example, chrome, aluminum, silver, titanium, tungsten, molybdenum, an alloy of these, or a stacked layer of these can be used. In addition, in the case of using an electrode as a transparent electrode, an oxide transparent conductive layer such as indium tin oxide (ITO) or indium zinc oxide can be used, but the material of the transparent electrode is not limited to these. A photolithography technique can be used for the formation of an electrode.

On the other hand, as a constituent material of a negative electrode, a material having a work function as small as possible is desirably used. For example, a single metal such as an alkali metal such as lithium, an alkali earth metal such as calcium, aluminum, titanium, manganese, silver, lead, or chrome, or a mixture containing these can be used. Alternatively, an alloy obtained by combining these single metals can also be used. For example, magnesium-silver, aluminum-lithium, aluminum-magnesium, silver-copper, or zinc-silver can be used. A metal oxide such as indium tin oxide (ITO) can also be used. One type of these electrode materials may be used by itself, or two or more types may be used in combination. In addition, a negative electrode may include a single layer, or may include a plurality of layers. Among these metals, it is desirable to use silver, and it is further desirable to use a silver alloy for preventing aggregation of silver. A ratio of an alloy is not limited as long as aggregation of silver can be prevented. For example, the ratio may be 1:1.

A negative electrode may function as a top emission element by using an oxide conductive layer such as ITO, or may function as a bottom emission element by using a repeller such as aluminum (Al), and the function of the negative electrode is not specifically limited. A formation method of the negative electrode is not specifically limited, but it is more desirable to use direct current sputtering or alternating current sputtering for better coverage of a film and for decreasing resistance.

[Protection Layer]

A protection layer may be provided on a negative electrode. For example, by bonding glass provided with a moisture absorbent onto the negative electrode, it is possible to prevent entry of water into an organic compound layer and prevent the occurrence of a display failure. In addition, as another exemplary embodiment, by providing a passivation film containing silicon nitride or the like, on the negative electrode, entry of water into an organic electroluminescence (EL) layer may be prevented. For example, by conveying a negative electrode 5 to another chamber without releasing a vacuum state after the negative electrode 5 is formed, and by forming a silicon nitride film having a thickness of 2 μm using the CVD method, a protection layer may be formed. After the film is formed using the CVD method, a protection layer may be provided using the ALD method.

[Color Filter]

A color filter may be provided on the protection layer. For example, a color filter considering the size of an organic light emitting element may be provided on another substrate, and the substrate provided with the color filter and a substrate provided with the organic light emitting element may be bonded. Alternatively, a color filter may be patterned onto the above-described protection layer using the photolithography technique. The color filter may include a high molecule.

[Planarizing Layer]

A planarizing layer may be included between a color filter and a protection layer. The planarizing layer may include an organic compound, and may include a low molecule or a high molecule, but desirably includes a high molecule.

Planarizing layers may be provided above and below the color filter, and constituent materials of the planarizing layers may be the same or different. Specifically, polyvinyl carbazole resin, polycarbonate resin, polyester resin, acrylonitrile butadiene styrene (ABS) resin, acrylic resin, polyimide resin, phenol resin, epoxy resin, silicon resin, or urea resin can be used.

[Opposing Substrate]

An opposing substrate may be provided on the planarizing layer. The opposing substrate is referred to as an opposing substrate because the opposing substrate is provided at a position opposing the above-described substrate. A constituent material of the opposing substrate may be the same as that of the above-described substrate.

[Organic Layer]

An organic layer (hole implantation layer, hole transport layer, electron inhibition layer, light emitting layer, hole inhibition layer, electron transport layer, electron implantation layer, etc.) included in a light emitting element according to an exemplary embodiment is formed using the following method.

An organic layer included in a light emitting element according to an exemplary embodiment can be formed using a dry process such as the vacuum deposition method, an ionized deposition method, sputtering, or plasma processing. Alternatively, a wet process of forming a layer by dissolving into an appropriate solvent and using a known application method (e.g., spin coating, dipping, a casting method, a Langmuir-Blodgett (LB) method, an inkjet method, etc.) can also be used in place of the dry process.

If a layer is formed using the vacuum deposition method or a solvent application method, crystallization is less likely to be generated, and good temporal stability can be obtained. In addition, when a layer is formed using an application method, the layer can also be formed using an appropriate binder resin in combination.

Examples of the above-described binder resin include polyvinyl carbazole resin, polycarbonate resin, polyester resin, ABS resin, acrylic resin, polyimide resin, phenol resin, epoxy resin, silicon resin, and urea resin. The above-described resins are examples, and the binder resin is not limited to these.

In addition, as a homopolymer or a copolymer, one type of these binder resins may be used by itself or two or more types may be mixed and used. Furthermore, an additive agent such as a known plasticizer, an antioxidant, or an ultraviolet absorber may be used in combination as necessary.

[Application of Light Emitting Apparatus According to First or Second Exemplary Embodiment]

A light emitting apparatus according to an exemplary embodiment can be used as a component of a display apparatus or an illumination apparatus. Aside from these, the light emitting apparatus can be applied to an exposure light source of an electrophotographic image forming apparatus, a backlight of a liquid crystal display apparatus, or a light emitting apparatus including a color filter in a white light source.

A display apparatus may be an image information processing apparatus that includes an image input unit that inputs image information from an area charge-coupled device (CCD) image sensor, a linear CCD image sensor, and a memory card, and an information processing unit that processes the input information, and displays an input image on a display unit.

In addition, a display unit included in an imaging apparatus or an inkjet printer may have a touch panel function. A driving method of the touch panel function is not specifically limited, and a touch panel may be an infrared touch panel, a capacitive touch panel, a resistive touch panel, or an electromagnetic induction touch panel. In addition, the display apparatus may be provided in a display unit of a multifunctional printer.

Figure 10:
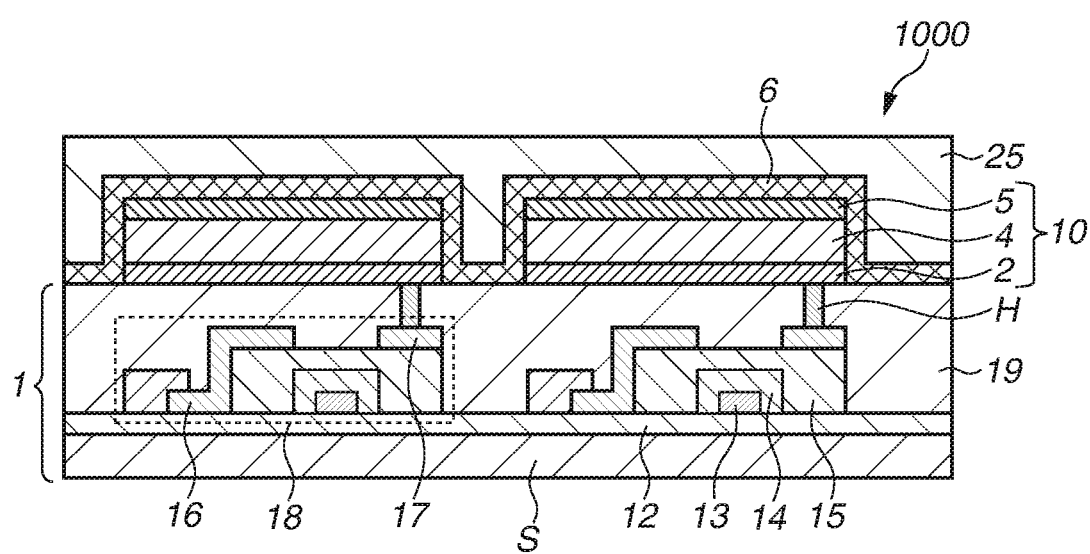
FIG. 10 is a schematic cross-sectional view illustrating an example of a display apparatus that uses a semiconductor apparatus according to a third exemplary embodiment.

Next, a display apparatus according to the present exemplary embodiment will be described with reference to the drawings. FIG. 10 is cross-sectional schematic diagram illustrating an example of a display apparatus including an organic light emitting element and a thin-film transistor (TFT) element connected to the organic light emitting element. The TFT element is an example of an active element.

A display apparatus 1000 illustrated in FIG. 10 includes a substrate S such as glass, and a dampproof film 12 provided on the substrate S for protecting a TFT element or an organic compound layer. The display apparatus 1000 further includes a gate electrode 13 of metal, a gate insulating film 14, and a semiconductor layer 15. The element substrate 1 includes the substrate S, a TFT element 18, and an insulating layer 19.

The TFT element 18 includes the semiconductor layer 15, a drain electrode 16, and a source electrode 17. The insulating layer 19 is provided above the TFT element 18. A positive electrode 2 included in a light emitting element and the source electrode 17 are connected via a contact hole H.

A method of electrically connecting electrodes (positive electrode and negative electrode) included in an organic light emitting element and electrodes (source electrode and drain electrode) included in a TFT is not limited to the method illustrated in FIG. 10. In other words, it is only required that either one of a positive electrode or a negative electrode and either one of a source electrode or a drain electrode of a TFT element are electrically connected.

FIG. 10 illustrates that the display apparatus 1000 only includes one organic layer, but the display apparatus 1000 may include a plurality of organic layers 4. A first protection layer 6 and a second protection layer 25 for suppressing deterioration of an organic light emitting element are provided on a negative electrode 5.

The display apparatus 1000 illustrated in FIG. 10 uses a transistor as a switching element, but a metal injection molding (MIM) element may be used as a switching element in place of the transistor.

In addition, a transistor used in the display apparatus 1000 illustrated in FIG. 10 is not limited to a transistor that uses a monocrystal silicon wafer, and a thin-film transistor including an active layer on an insulating surface of a substrate may be used. Examples of the active layer include monocrystal silicon, amorphous silicon, non-monocrystal silicon such as microcrystal silicon, and non-monocrystal oxide semiconductor such as indium zinc oxide or indium gallium zinc oxide. The thin-film transistor will also be referred to as a TFT element.

A transistor included in the display apparatus 1000 illustrated in FIG. 10 may be formed in a substrate such as a Si substrate. That a transistor is formed in a substrate means that a transistor is manufactured by processing a substrate such as a Si substrate. In other words, a transistor included in a substrate can also be regarded as a transistor integrally formed with a substrate.

The light emission brightness of a light emitting element 10 according to the present exemplary embodiment is controlled by a TFT that is an example of a switching element, and by providing a plurality of light emitting elements 10 in a surface, an image can be displayed at each light emission brightness. The switching element according to the present exemplary embodiment is not limited to a TFT, and may be a transistor formed of low-temperature polysilicon, or an active matrix driver formed on a substrate such as a Si substrate. Being formed on a substrate can also be said as being formed in the substrate. Whether to provide a transistor in a substrate or to use a TFT can be selected depending on the size of a display unit. For example, if the size of a display unit is about 0.5 inches, it is desirable that a light emitting element is provided on a Si substrate.

Figure 11:
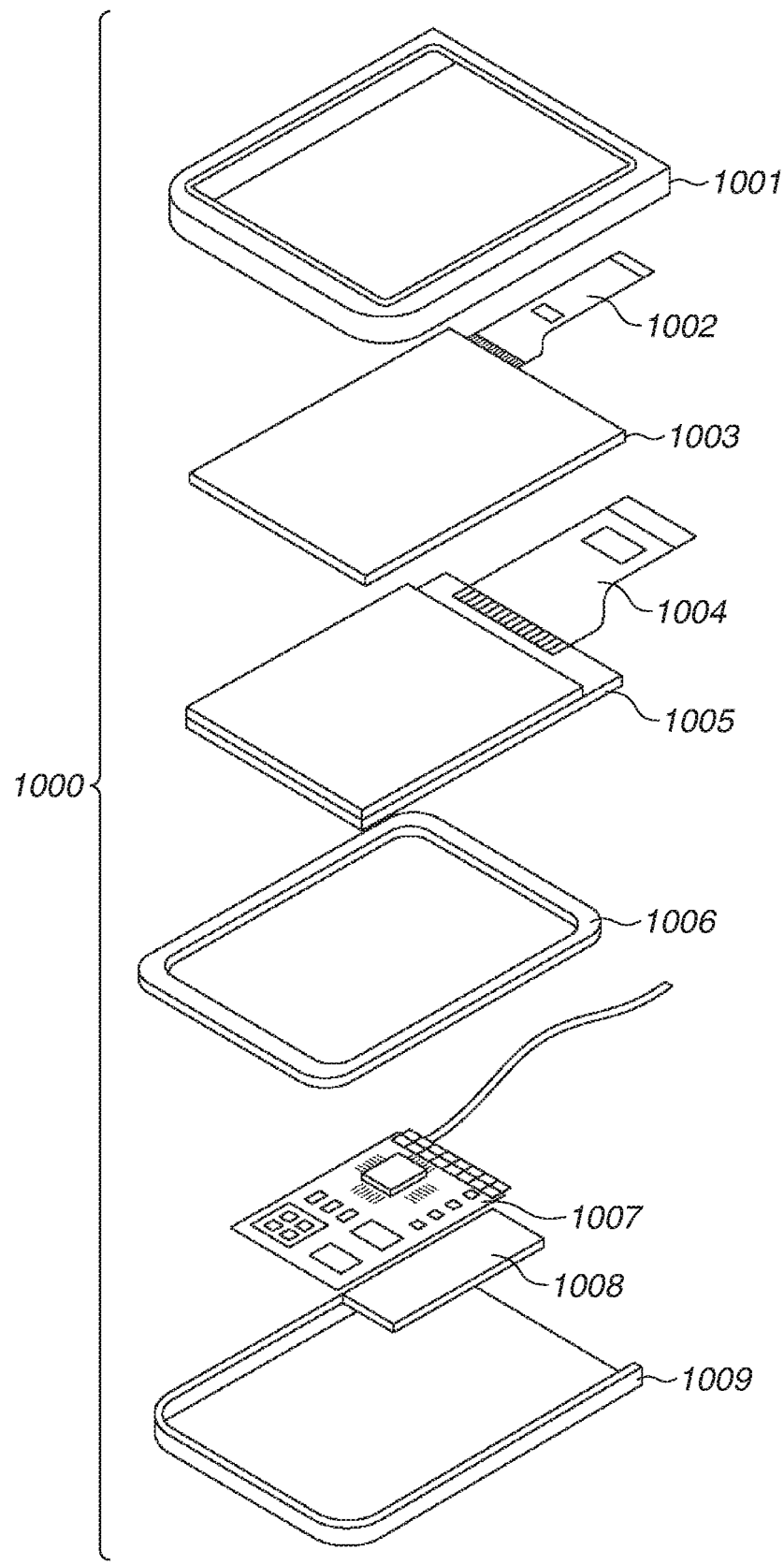
FIG. 11 is a schematic diagram illustrating an example of a display apparatus according to the third exemplary embodiment.

FIG. 11 is a schematic diagram illustrating an example of the display apparatus according to the present exemplary embodiment. The display apparatus 1000 may include a touch panel 1003, a display panel 1005, a frame 1006, a circuit substrate 1007, and a battery 1008 between an upper cover 1001 and a lower cover 1009. Flexible printed circuits (FPCs) 1002 and 1004, respectively are connected to the touch panel 1003 and the display panel 1005. A transistor is printed on the circuit substrate 1007. The battery 1008 needs not be provided if the display apparatus 1000 is not a portable device. Even if the display apparatus 1000 is a portable device, the battery 1008 may be provided at another position.

The display apparatus according to the present exemplary embodiment may be used in a display unit of a photoelectric conversion apparatus including an optical unit including a plurality of lenses, and an image sensor that receives light having passed through the optical unit. The photoelectric conversion apparatus may include a display unit that displays information acquired by a plurality of image sensors included in an imaging unit. In addition, the photoelectric conversion apparatus may acquire information using information acquired by an image sensor, and a display unit may display information different from the information.

An image sensor may be a photoelectric conversion element in which an organic layer of the light emitting apparatus described in the first or second exemplary embodiment is replaced with a photoelectric conversion layer. In this case, the photoelectric conversion apparatus includes a plurality of the photoelectric conversion elements in an imaging unit.

The display unit may be a display unit exposed to the outside of the photoelectric conversion apparatus, or may be a display unit arranged within a viewfinder. The photoelectric conversion apparatus may be a digital camera or a digital video camera.

Figure 12A:
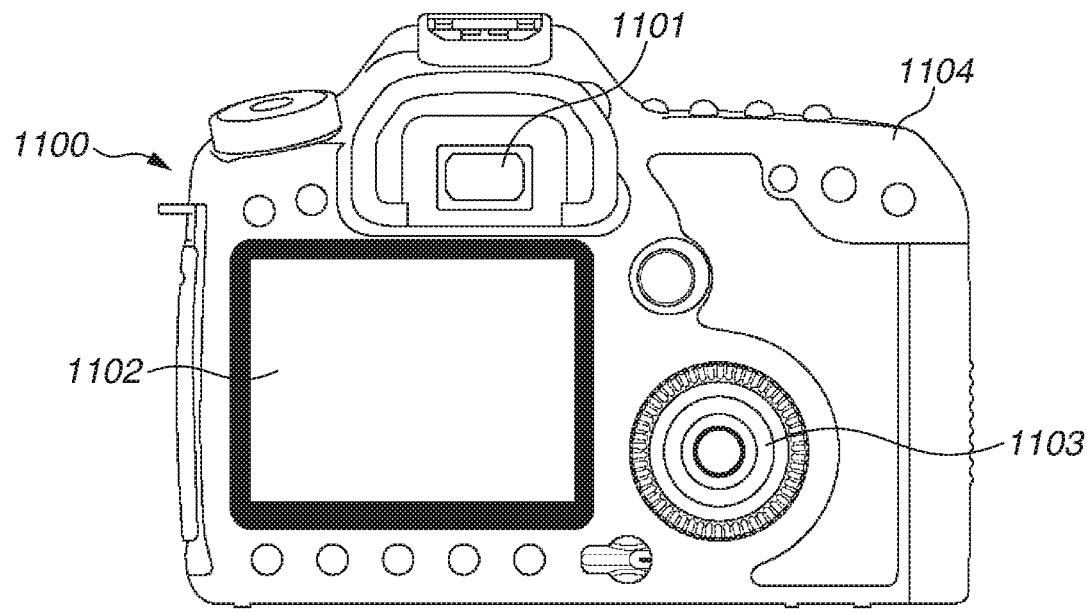
FIG. 12A is a schematic diagram illustrating an example of a photoelectric conversion apparatus according to an exemplary embodiment.

FIG. 12A is a schematic diagram illustrating an example of a photoelectric conversion apparatus according to the present exemplary embodiment. A photoelectric conversion apparatus 1100 may include a viewfinder 1101, a back-surface display 1102, an operation unit 1103, and a casing 1104. The viewfinder 1101 may include the display apparatus according to the present exemplary embodiment. In this case, the display apparatus may display not only an image to be captured but also environmental information and an image capturing instruction. The environmental information may include the intensity of outside light, the orientation of outside light, a speed at which a subject moves, and a possibility of a subject being shielded by a shielding object.

Because a timing suitable for image capturing is a small amount of time, it is desirable to display information as early as possible. It is accordingly desirable to use a display apparatus that uses an organic light emitting element according to an exemplary embodiment of the present disclosure. This is because an organic light emitting element has high response speed. The display apparatus that uses an organic light emitting element can be desirably used in these apparatuses requiring a display speed, rather than a liquid crystal display apparatus.

The photoelectric conversion apparatus 1100 includes an optical unit (not illustrated). The optical unit includes a plurality of lenses, and forms an image onto an image sensor stored in the casing 1104. By adjusting relative positions of the plurality of lenses, a focal point can be adjusted. This operation can also be performed automatically.

The display apparatus according to the present exemplary embodiment may include color filters having red color, green color, and blue color. In the color filter, the red color, the green color, and the blue color may be arranged in a delta array.

The display apparatus according to the present exemplary embodiment may be used in a display unit of a mobile terminal. In this case, the display apparatus may have both of a display function and an operation function. Examples of the mobile terminal include a mobile phone such as a smartphone, a tablet, and a head-mounted display.

Figure 12B:
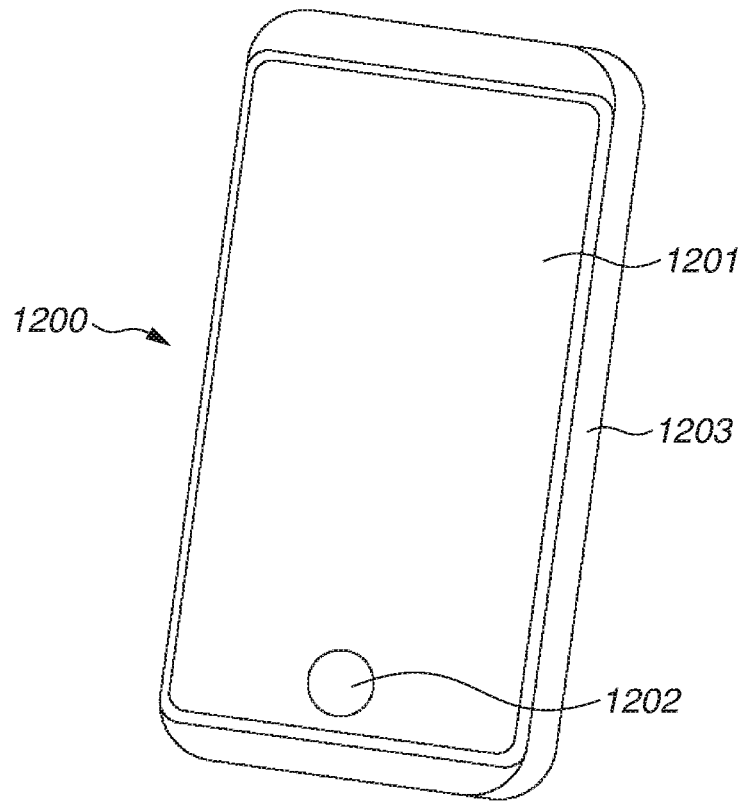
FIG. 12B is a schematic diagram illustrating an example of an electronic device according to the third exemplary embodiment.

FIG. 12B is a schematic diagram illustrating an example of an electronic device according to the present exemplary embodiment. An electronic device 1200 includes a display unit 1201, an operation unit 1202, and a casing 1203. The casing 1203 may include a circuit, a printed substrate including the circuit, a battery, and a communication unit. The operation unit 1202 may be a button or may be a touch panel type reaction unit. The operation unit 1202 may be a biometric authentication unit for unlocking the electronic device 1200 by recognizing a fingerprint. An electronic device including a communication unit can also be said as a communication device.

Figure 13A:
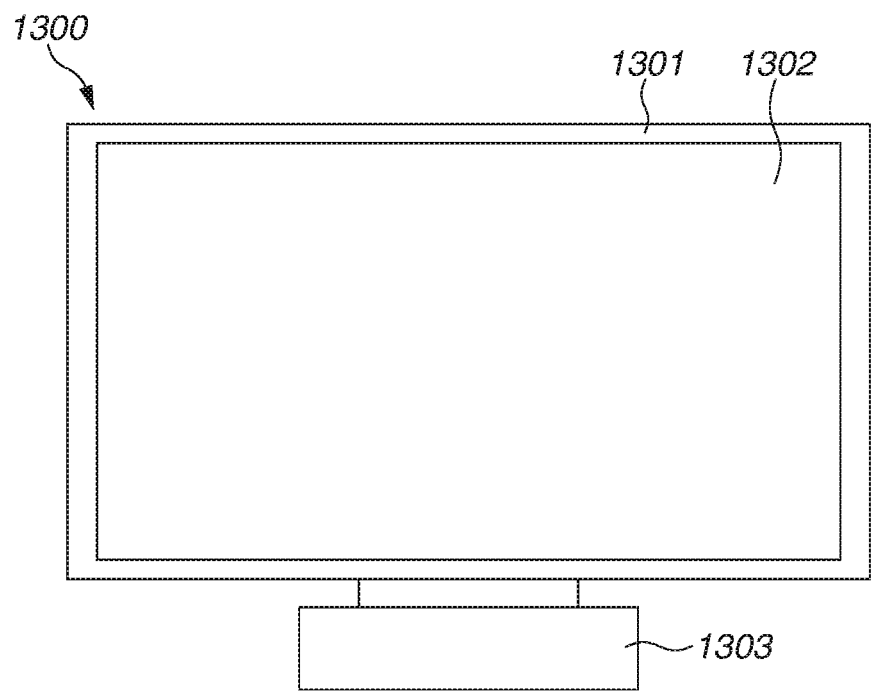
FIG. 13A is a schematic diagram illustrating an example of a display apparatus according to the third exemplary embodiment.
Figure 13B:
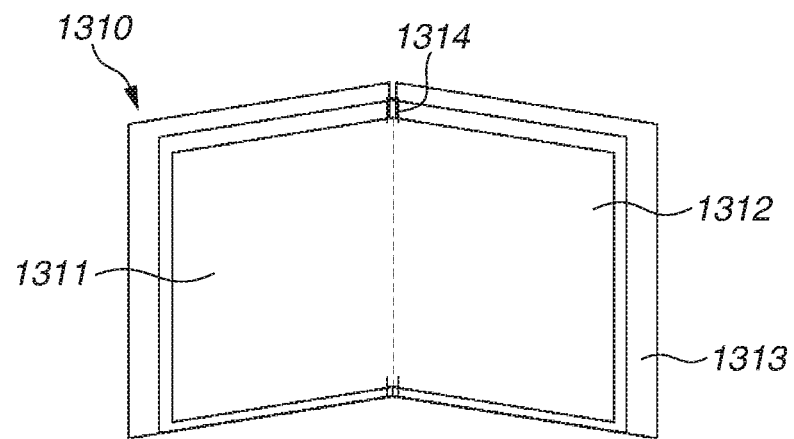
FIG. 13B is a schematic diagram illustrating an example of a foldable display apparatus.

FIGS. 13A and 13B are schematic diagrams each illustrating an example of the display apparatus according to the present exemplary embodiment. FIG. 13A illustrates a display apparatus such as a television monitor or a personal computer (PC) monitor. A display apparatus 1300 includes a frame 1301 and a display unit 1302. The light emitting apparatus according to the present exemplary embodiment may be used in the display unit 1302.

The display apparatus 1300 further includes a base 1303 supporting the frame 1301 and the display unit 1302. The shape of the base 1303 is not limited to the shape illustrated in FIG. 13A. A lower side of the frame 1301 may also serve as a base.

In addition, the frame 1301 and the display unit 1302 may have a curved shape. The curvature radius of the curved shape may be 5000 mm or more and 6000 mm or less.

FIG. 13B is a schematic diagram illustrating another example of the display apparatus according to the present exemplary embodiment. A display apparatus 1310 illustrated in FIG. 13B has a foldable configuration, and is a so-called foldable display apparatus. The display apparatus 1310 includes a first display unit 1311, a second display unit 1312, a casing 1313, and a folding point 1314. The first display unit 1311 and the second display unit 1312 may include the light emitting apparatus according to the present exemplary embodiment. The first display unit 1311 and the second display unit 1312 may form a seamless one display apparatus. The first display unit 1311 and the second display unit 1312 can be divided at the folding point 1314. The first display unit 1311 and the second display unit 1312 may individually display different images, or may display one image in cooperation.

Figure 14A:
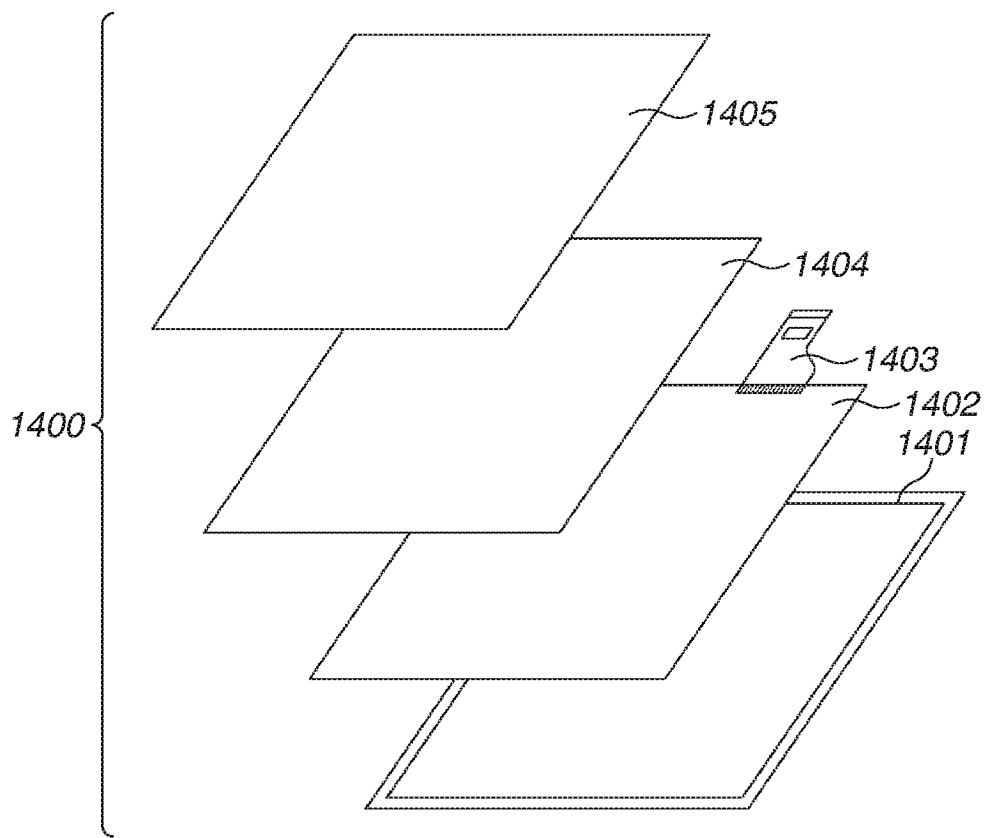
FIG. 14A is a schematic diagram illustrating an example of an illumination apparatus according to the third exemplary embodiment.

FIG. 14A is a schematic diagram illustrating an example of an illumination apparatus according to the present exemplary embodiment. An illumination apparatus 1400 includes a casing 1401, a light source 1402, a circuit substrate 1403, an optical filter 1404, and a light diffusion unit 1405. The light source 1402 may include the organic light emitting element according to the present exemplary embodiment. The optical filter 1404 may be a filter that enhances color rendering properties of the light source 1402. The light diffusion unit 1405 can efficiently diffuse light of the light source 1402 by lighting up, for example, and can deliver light to a wide range. The optical filter 1404 and the light diffusion unit 1405 may be provided on a light emission side of illumination. A cover may be provided as necessary at an outermost portion.

The illumination apparatus is an apparatus that illuminates the inside of a room, for example. The illumination apparatus may emit light in any color of white color, neutral white color, and other colors from blue to red. The illumination apparatus may include a light control circuit for controlling these colors. The illumination apparatus may include an organic light emitting element according to an exemplary embodiment of the present disclosure, and a power circuit connected to the organic light emitting element. The power circuit is a circuit that converts an alternating-current voltage into a direct-current voltage. In addition, a color temperature of the white color is 4200 K and a color temperature of the neutral white color is 5000 K. The illumination apparatus may include a color filter.

In addition, the illumination apparatus according to the present exemplary embodiment may include a heat release unit. The heat release unit releases heat in the apparatus to the outside of the apparatus, and a metal with high specific heat or liquid silicon can be used.

Figure 14B:
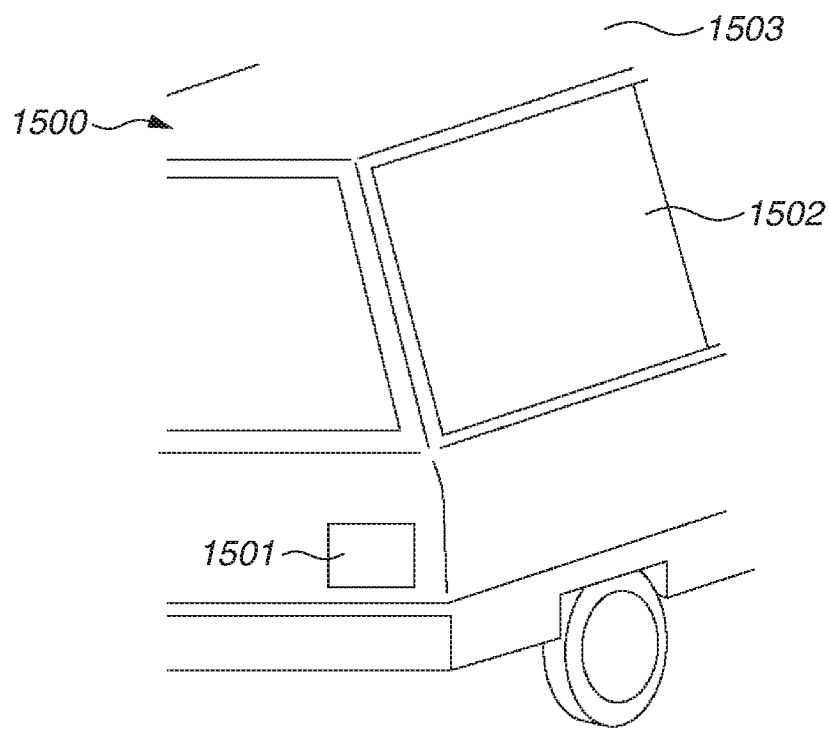
FIG. 14B is a schematic diagram illustrating an example of an automobile including an in-vehicle illumination device according to the third exemplary embodiment.

FIG. 14B is a schematic diagram illustrating an automobile that is an example of a movable body according to the present exemplary embodiment. The automobile includes a tail lamp that is an example of an illumination device. An automobile 1500 may include a tail lamp 1501, and may be configured to light the tail lamp 1501 when performing a brake operation.

The tail lamp 1501 may include a light emitting element according to the first or second exemplary embodiment. The tail lamp 1501 may include a protection member that protects the light emitting element. The material of the protection member is not limited as long as the protection member is transparent and has a certain level of high strength, but it is desirable that the protection member is formed of polycarbonate or the like. A furandicarboxylic acid derivative or an acrylonitrile derivative may be mixed with polycarbonate.

The automobile 1500 may include a vehicle body 1503 and a window 1502 attached to the vehicle body 1503. The window 1502 may be a transparent display if the window 1502 is not a window for checking the front side and the back side of the automobile 1500. The transparent display may include the light emitting element according to the first or second exemplary embodiment. In this case, a transparent member is used as a constituent material of an electrode included in an organic light emitting element.

The movable body according to the present exemplary embodiment may be a ship, an airplane, or a drone. The movable body may include a fuselage and an illumination device provided on the fuselage. The illumination device may emit light for reporting the position of the fuselage. The illumination device includes the light emitting apparatus according to the first or second exemplary embodiment.

As described above, by using the light emitting apparatus according to the present exemplary embodiment, stable display with high image quality is enabled even when display is performed for a long time.

It is possible to provide a semiconductor apparatus with a suppressed leak current between a lower electrode and an upper electrode.

While the present disclosure has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2019-158971, filed Aug. 30, 2019, which is hereby incorporated by reference herein in its entirety.

What is claimed is:

1. A semiconductor apparatus comprising:
    a first electrode arranged on an element substrate;
    an insulating layer covering an end of the first electrode and being arranged on the element substrate;
    a functional layer arranged on the first electrode and the insulating layer; and
    a second electrode arranged above the first electrode and the insulating layer via the functional layer,
    wherein, in a cross-section passing through the element substrate, the insulating layer, and the functional layer, the insulating layer includes
    a first portion having a side surface inclining at an angle of 45° or more and 90° or less with respect to a parallel surface parallel to a bottom surface of the first electrode,
    a second portion closer to a side of the element substrate than the first portion, and having a side surface inclining at an angle larger than 0° and smaller than 45° with respect to the parallel surface, and
    a third portion on a side opposite to the element substrate with respect to the first portion, and having a side surface inclining at an angle larger than 0° and smaller than 45° with respect to the parallel surface, and
    wherein, in the cross-sectional, a length of the second portion in a direction vertical to the parallel surface is larger than a length of the third portion in the vertical direction, and
    wherein the first portion includes a fourth portion having a side surface inclining at an angle of 55° or more and 90° or less with respect to the parallel surface, and a length of the fourth portion in a direction vertical to the parallel surface is 50 nm or less.

2. The semiconductor apparatus according to claim 1, wherein a length of the first portion in a direction vertical to the parallel surface is smaller than a thickness of the first electrode.

3. The semiconductor apparatus according to claim 1, wherein the insulating layer further includes a fifth portion closer to the side of the element substrate than the second portion, and having a side surface parallel to the parallel surface.

4. The semiconductor apparatus according to claim 1, wherein the insulating layer contains an inorganic material.

5. The semiconductor apparatus according to claim 1, wherein the insulating layer includes at least one of silicone oxide, silicon nitride, or silicon oxynitride.

6. The semiconductor apparatus according to claim 1,
    wherein the element substrate includes a substrate and an interlayer insulating layer arranged on the substrate,
    wherein the interlayer insulating layer includes a first insulating portion in contact with the bottom surface of the first electrode, and a second insulating portion positioned next to the first insulating portion and in contact with the insulating layer, and
    wherein, in the cross-sectional, a top surface of the second insulating portion inclines with respect to the parallel surface.

7. The semiconductor apparatus according to claim 6, wherein, in the cross-sectional, the top surface of the second insulating portion inclines at an angle smaller than 45° with respect to the parallel surface.

8. The semiconductor apparatus according to claim 7, wherein, in the cross-sectional, a distance from the top surface of the second insulating portion to the substrate in the vertical direction is smaller than a distance from the bottom surface of the first electrode to the substrate in the vertical direction.

9. A photoelectric conversion apparatus comprising:
    an optical unit including a plurality of lenses;
    an image sensor configured to receive light having passed through the optical unit; and
    a display unit configured to display an image captured by the image sensor,
    wherein the display unit includes the semiconductor apparatus according to claim 1.

10. An electronic device comprising:
    a display unit including the semiconductor apparatus according to claim 1;
    a casing on which the display unit is provided; and
    a communication unit that is provided in the casing and is configured to communicate with an external device.

11. An illumination apparatus comprising:
    a light source including the semiconductor apparatus according to claim 1; and
    a light diffusion unit or an optical filter configured to let through light emitted by the light source.

12. A movable body comprising:
    an illumination device including the semiconductor apparatus according to claim 1; and
    a fuselage on which the illumination device is provided.

13. A photoelectric conversion apparatus comprising:
an optical unit including a plurality of lenses; and
an imaging unit configured to receive light having passed through the optical unit,
wherein the imaging unit includes the semiconductor apparatus according to claim 1.

14. A display apparatus comprising:
the semiconductor apparatus according to claim 1; and
a plurality of pixels, at least one of the plurality of pixels including a light emitting element including the first electrode, the functional layer, and the second electrode, and a transistor connected to the light emitting element.

\* \* \* \* \*